United States Patent
Yamaji

(10) Patent No.: US 8,344,477 B2
(45) Date of Patent: Jan. 1, 2013

(54) SEMICONDUCTOR CHIP, SEMICONDUCTOR WAFER, METHOD OF MANUFACTURING SEMICONDUCTOR CHIP

(75) Inventor: Masafumi Yamaji, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 407 days.

(21) Appl. No.: 12/801,054

(22) Filed: May 19, 2010

(65) Prior Publication Data
US 2010/0327403 A1    Dec. 30, 2010

(30) Foreign Application Priority Data
Jun. 30, 2009    (JP) .................................. 2009-154733

(51) Int. Cl.
*H01L 23/52*    (2006.01)
(52) U.S. Cl. ........ 257/530; 257/786; 257/773; 257/529; 257/E23.019; 257/E21.495; 438/618
(58) Field of Classification Search .................. 257/786, 257/530, 773, 529, E23.019, E21.495, E23.01, 257/E23.147; 438/618
See application file for complete search history.

(56) References Cited

U.S. PATENT DOCUMENTS

| | | | |
|---|---|---|---|
| 6,188,133 B1* | 2/2001 | Shizuno ........................ | 257/734 |
| 6,727,118 B2* | 4/2004 | Lasky et al. .................... | 438/108 |
| 6,753,611 B1* | 6/2004 | Maeno et al. .................. | 257/774 |
| 7,382,053 B2* | 6/2008 | Takahata ........................ | 257/774 |
| 7,456,721 B2* | 11/2008 | Chiu ............................... | 336/200 |
| 7,719,115 B2* | 5/2010 | Seta ................................ | 257/758 |
| 7,728,444 B2* | 6/2010 | Hayashi ......................... | 257/786 |
| 7,859,111 B2* | 12/2010 | Okumura ....................... | 257/758 |
| 7,915,647 B2* | 3/2011 | Kato et al. ..................... | 257/210 |
| 2003/0071364 A1* | 4/2003 | Kusakabe et al. ............. | 257/784 |
| 2004/0262640 A1* | 12/2004 | Suga .............................. | 257/202 |
| 2007/0069341 A1* | 3/2007 | Usami ............................ | 257/666 |
| 2007/0075440 A1* | 4/2007 | Osanai et al. ................. | 257/786 |
| 2007/0202664 A1 | 8/2007 | Aoki | |
| 2008/0164622 A1* | 7/2008 | Hayashi ......................... | 257/786 |
| 2008/0179707 A1* | 7/2008 | Ogawa .......................... | 257/529 |
| 2010/0052120 A1* | 3/2010 | Pruitt ............................. | 257/666 |
| 2010/0148218 A1* | 6/2010 | Yokoyama .................... | 257/203 |

FOREIGN PATENT DOCUMENTS

JP    2007-243132 A    9/2007

* cited by examiner

*Primary Examiner* — N Drew Richards
*Assistant Examiner* — Ankush Singal
(74) *Attorney, Agent, or Firm* — McGinn IP Law Group, PLLC

(57) ABSTRACT

One exemplary embodiment includes a semiconductor chip that has a rectangle principal surface including a first and a second side that oppose each other. A first and a second semiconductor element, and a first and a second wire are formed on the principal surface. The first wire is formed from the first side to reach the second side, and coupled to the first semiconductor element. The second wire is formed to contact at least the first wire, and coupled to the second semiconductor element. Further, an edge part of the first wire on the second side and an edge part of the second wire on the first side are placed to substantially position on a common straight line which is vertical to the first and the second sides.

13 Claims, 17 Drawing Sheets

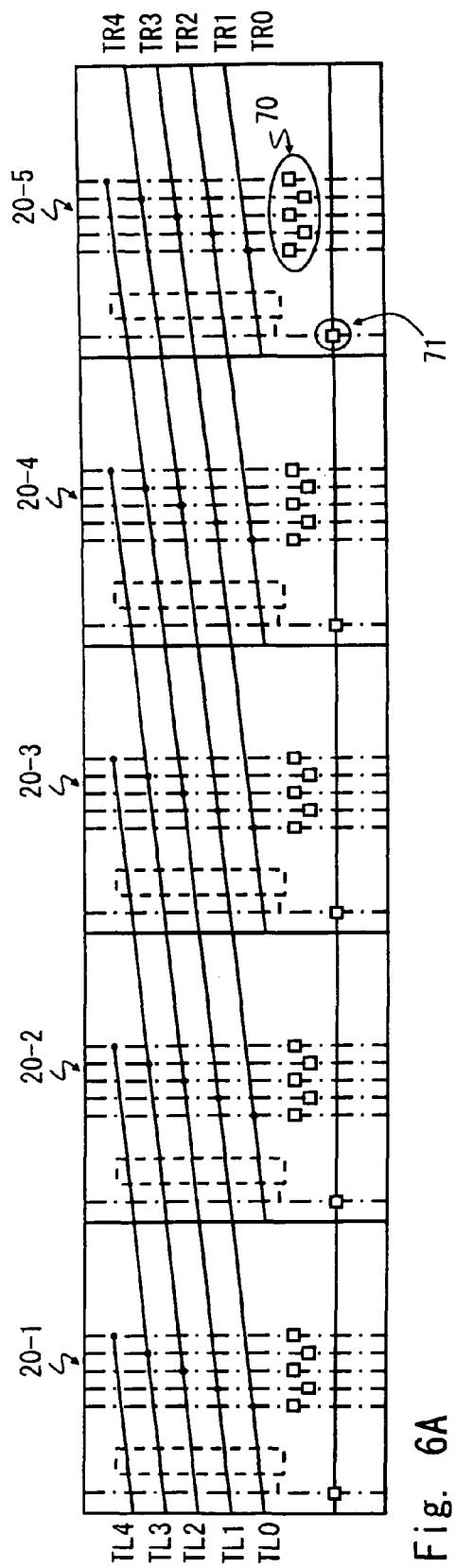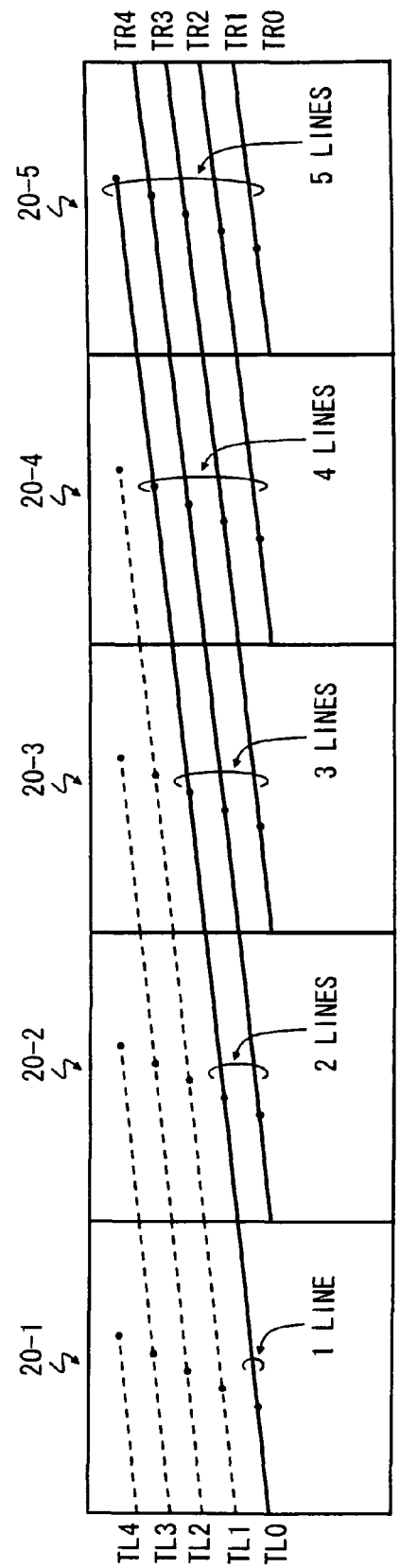
Fig. 6A
Fig. 6B

SEMICONDUCTOR CHIP, SEMICONDUCTOR WAFER, METHOD OF MANUFACTURING SEMICONDUCTOR CHIP

INCORPORATION BY REFERENCE

This application is based upon and claims the benefit of priority from Japanese patent application No. 2009-154733, filed on Jun. 30, 2009, the disclosure of which is incorporated herein in its entirety by reference.

BACKGROUND

1. Field of the Invention

The present invention relates to a technique for performing different operations (electrical write operation of chip IDs, for example) depending on the chip position in the wafer surface, for each of chips cut from one wafer.

2. Description of Related Art

In order to enable to identify the position in the wafer surface where a semiconductor integrated circuit (chip) is formed therefrom, a chip ID is provided to each chip. The chip ID is provided to each chip by recording the position information in the wafer surface to PROM (Programmable Read Only Memory) formed in the chip, for example. If a fuse ROM is used as PROM, fuse elements (or anti-fuse elements) formed in each chip are selectively disconnected (or made conductive) according to the chip position in the wafer surface. Specifically, in a wafer test process after a wafer process, it requires to write an ID for each chip using a tester or prober.

There is also a known method that prints a mark indicating a chip ID to each chip instead of electrically recording the identification information to PROM. The mark printed to each chip can be visually recognized using an electron microscope. AOKI discloses, in Japanese Unexamined Patent Application Publication No. 2007-243132, a method to print chip IDs to a wiring layer or an interlayer film by preparing multiple masks for forming marks, and repeatedly performing a lithography process using the multiple masks. The method disclosed by AOKI is characterized in that the multiple masks for forming masks include a combination of masks, each with different number of printing chips in one shot. For example, if a first mask capable of printing 16 chips (four rows by four columns), and a second mask capable of printing nine chips (three rows by three columns), are used, unique chip IDs can be provided respectively up to 144 chips (12 rows by 12 columns). The 12 rows (12 columns) is the least common multiple of the four rows (four columns) of the first mask and three rows (three columns) of the second mask.

SUMMARY

The present inventor has found a problem when chip IDs are electrically written that the amount of work required to provide chip IDs is large. The cause of this problem is because it is necessary to repeat the write operation, including a probe scan and an electric signal output of a tester, in order to write different chip IDs in PPROM of each chip.

The situation in which the amount of work increases in the wafer test process using a tester and a prober is not limited to the abovementioned electrical write operation of chip IDs. That is, the more tasks required to perform different electrical operations for each chip in a completed wafer surface, the more amount of work in the wafer test process.

Note that the method to provide chip IDs disclosed by AOKI is not the electrical write operation of chip IDs. Therefore, if it is necessary to electrically write chip IDs in PROM, more generally, if an electrical operation is required for each chip in the wafer test process, the amount of work cannot be reduced using the technique disclosed by AOKI.

A first exemplary aspect of the present invention includes a semiconductor chip that includes a rectangle principal surface including a first and a second side that oppose each other. A first and a second semiconductor element, and a first and a second wire are formed on the principal surface. The first wire is formed from the first side to reach the second side, and also coupled to the first semiconductor element. The second wire is formed to contact at least the first side, and also coupled to the second semiconductor element. Further, an edge part of the first wire on the second side and an edge part of the second wire on the first side are placed to substantially position on a common straight line which is vertical to the first and the second sides.

The expression "substantially positioned" here is used in consideration that the first and the second wires on the scribe line are removed at the time of dicing, and an edge part of the chip may be cracked, thereby causing to lose a part of the first and the second wires. In such case, the edge position of the first wire on the second side after the dicing process does not "precisely" match the edge position of the second wire on the first side. However, they substantially match if the abovementioned loss at the time of the dicing process is taken into consideration.

According to the first exemplary aspect of the present invention, the first wire of one chip and the second wire of the other chip of two adjacent chips in the wafer state are connected. Therefore, by supplying an electric signal to the first wire of the one of the two adjacent chips, the first semiconductor element included in the one chip and the second semiconductor element included in the other chip can be electrically operated at the same time. For example, if non-volatile memory devices are used for the first and the second semiconductor elements, the operation to write different chip IDs in the two adjacent chips can be collectively performed. That is, electrical operations (write operation of chip IDs or the like) of different contents for each chip can be performed by the unit of multiple chips, not by each chip.

A second exemplary aspect of the present invention includes a semiconductor wafer that includes m (m is an integer of two or more) number of semiconductor chips that are placed to be adjacent in one direction. Each chip includes a rectangle principal surface including a first and a second side that oppose each other, and the first side of one of the adjacent chips contacts the second side of another of the adjacent chips. Further, the m number of chips includes a wiring pattern that repeats by a unit of n (n is an integer from 1 to m/2) number of chips, The wiring pattern includes j (j is an integer of m or more) number of wires. At least (m−n) number of wires among the j number of wires contact the first side of one endmost chip among the n number of chips, and the (m−n) number of wires are extend over the principal surface of the other endmost chip among the n number of chips. Further, at least (m−n) number of wires among the j number of wires contact the second side of the other endmost chip, and at least one wire among the (m−n) number of wires contacting the second side of the other endmost chip extends over the principal surface of the one endmost chip. Accordingly, at least (m−2n) number of wires among the j number of wires are formed to penetrate from the first side of the one endmost chip to the second side of the other endmost chip. Moreover, each of the j number of wires is coupled to a semiconductor circuit over at least a part of the principal surfaces among the principal surfaces of the n number of chips. Furthermore, each of edge parts of the (m−n)

number of wires contacting the first side of the one endmost chip is placed substantially position on a common straight line with one of edge parts of different wires than itself among the (m−n) number, of wires contacting the second side of the other endmost chip, the common straight line is vertical to the first and the second sides. According to the second exemplary aspect of the present invention, continuous wires are formed among m number of chips. Further, by performing an electrical operation to one of the m number of semiconductor chips, different electrical operations can be performed to the semiconductor circuits included in other chips at the same time. That is, the electrical operations (write operation of chip IDs or the like) of different contents for each chip can be performed by the unit of multiple chips, not by each chip.

The first and the second exemplary aspect of the present invention enable to perform electrical operations of different contents for each chip (write operation of chip IDs or the like) to the multiple chips in the wafer surface by the unit of multiple chips, not by each chip.

BRIEF DESCRIPTION OF THE DRAWINGS

The above and other exemplary aspects, advantages and features will be more apparent from the following description of certain exemplary embodiments taken in conjunction with the accompanying drawings, in which:

FIGS. 6A and 6B illustrate an arrangement of a wafer in which the semiconductor chips of FIG. 4 are adjacent in the horizontal direction;

DETAILED DESCRIPTION OF THE EXEMPLARY EMBODIMENTS

Figure 1:
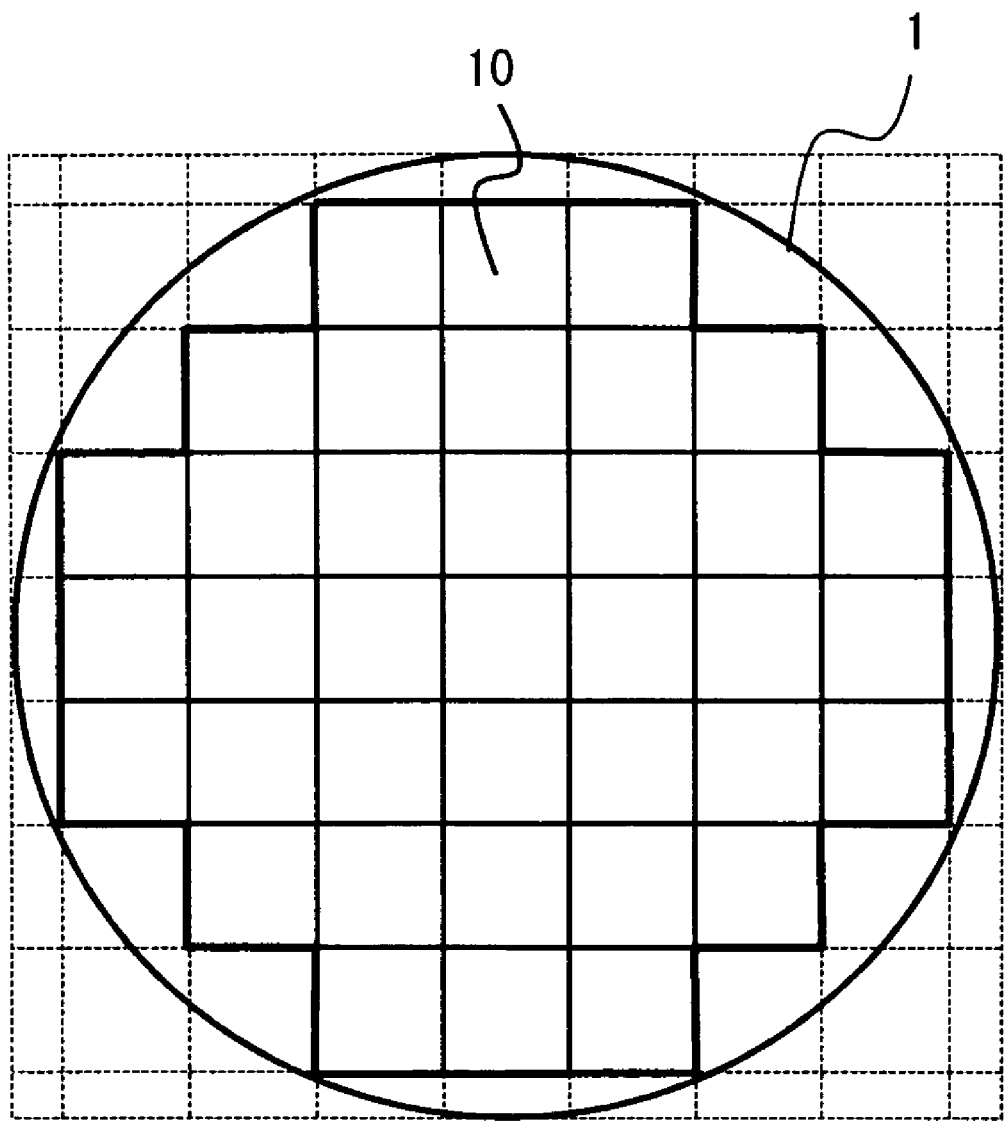
FIG. 1 is a plan view of a semiconductor wafer and chips according to a first exemplary embodiment.

Exemplary embodiments of the present invention will be described in detail below with reference to the accompanying drawings. The same components are denoted by the same reference numerals throughout the drawings, and a repeated description thereof is omitted as appropriate to clarify the explanation.

[First Exemplary Embodiment]

Figure 2:
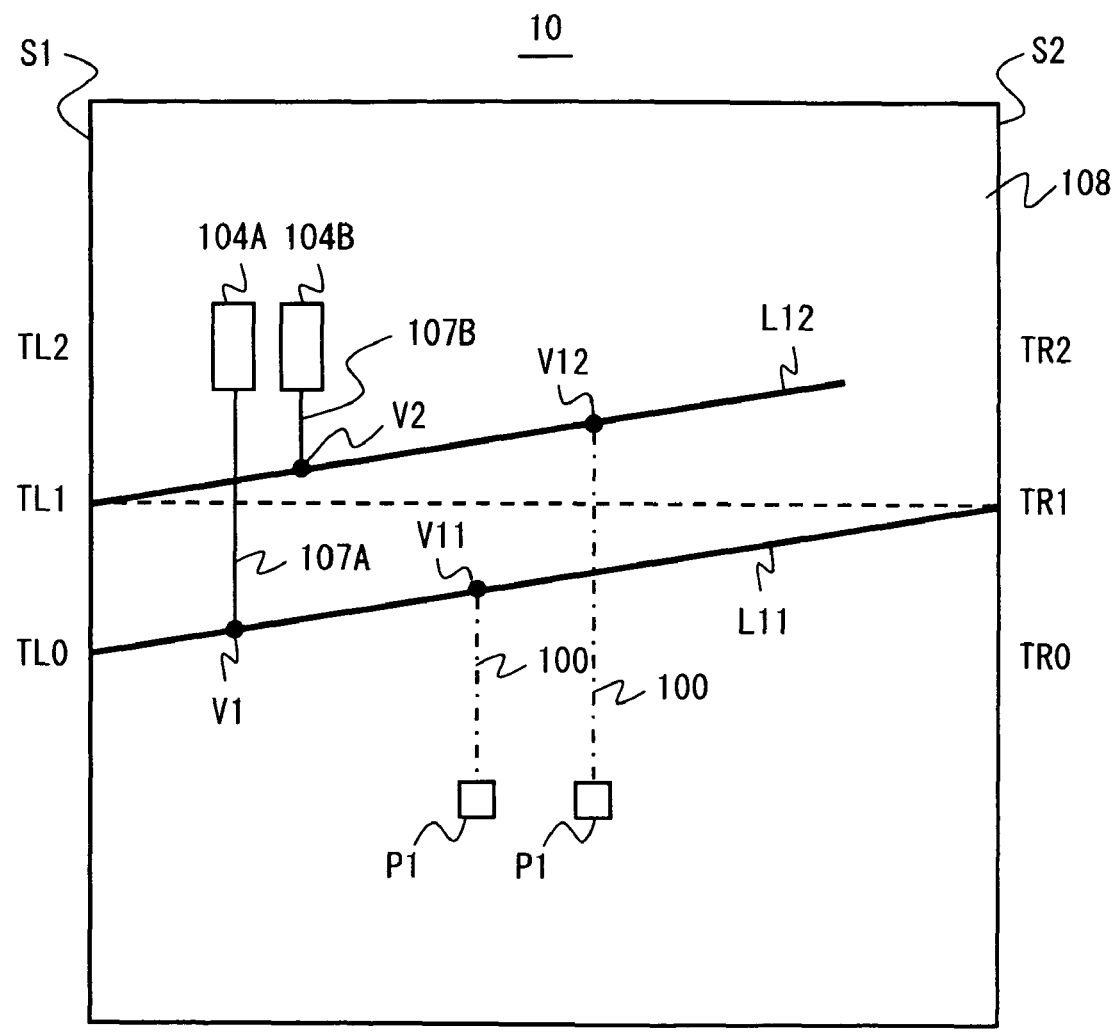
FIG. 2 is a plan view of the semiconductor chip according to the first exemplary embodiment.

FIG. 1 illustrates a wafer 1 according to this exemplary embodiment. The wafer 1 includes multiple chips 10, which are placed to be adjacent in the vertical and the horizontal directions. FIG. 2 is a block diagram illustrating the configuration of the chip 10. FIG. 2 illustrates only the components that are considered to be necessary for the explanation of this exemplary embodiment.

In FIG. 2, wires L11 and L12 are formed in one of wiring layers provided to a rectangle principal surface 108 of the chip 10, for example in the top wiring layer. The wire L11 is formed from a left side S1 to reach a right side S2. The wire L12 is formed to contact at least the left side S1. The wire L12 may be formed from the left side S1 to reach the right side S2, in a similar way as the wire L11. An edge part TR1 of the wire L11 on the right side S2 and an edge part TL1 of the wire L12 on the left side S1 are placed to oppose each other. In other words, the edge parts TR1 and TL1 are placed to substantially position on a common straight line which is vertical to the left and the right sides S1 and S2 (i.e. a dashed line described in FIG. 2).

A semiconductor element 104A is connected to the wire L11 via a wire 107A. Similarly, a semiconductor element 104B is connected to the wire L12 via a wire 107B. The wires 107A and 107B are formed in a different wiring layer from the wires L11 and L12, and may be connected to the wires L11 and L12 using plugs V1 and V2 embedded in a holes (what is called via-holes) formed in an interlayer film.

Two electrodes P1 are placed on the surface of the chip 10, and are connected to the wire L11 and L12 via wires 100, and the plugs V11 and V12. An electric signal can be supplied to the wire L11 from one electrode P1, and to the L12 from another electrode P1. Note that the electrode P1 is not necessarily provided to all of the chips 10 existing in the wafer 1, but may be provided to some of the chips 10. As will be described with reference to FIG. 3 below, this is because that an electric signal can be supplied to either one or both of the wires L11 and L12 from another chip 10 that is adjacent in the wafer.

Figure 3:
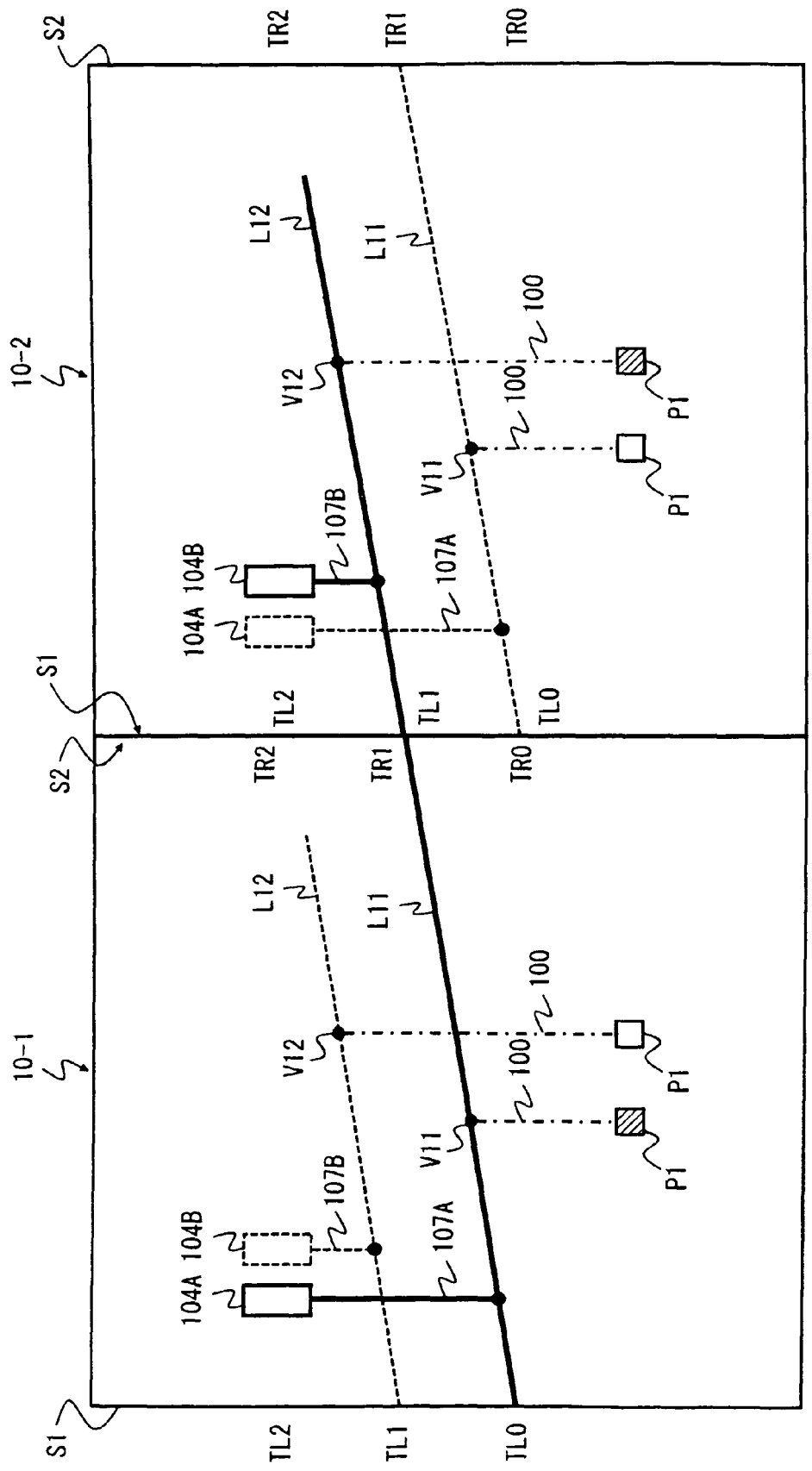
FIG. 3 illustrates an arrangement of a wafer in which the semiconductor chips of FIG. 2 are adjacent in the horizontal direction.

FIG. 3 illustrates a part of the wafer 1 including two chips 10-1 and 10-2 placed to be adjacent. Specifically, the right side S2 of the chip 10-1 contacts the left side S1 of the chip 10-2. As can be seen in FIG. 3, the wire L11 included in the chip 10-1 and the wire L12 included in the chip 10-2 are connected to each other across the boundary of the chips. Accordingly, for example by connecting a probe to the electrode P1 over the wire L11 of the chip 10-1, and supplying an electric signal, the semiconductor element 104A included in the chip 10-1 and the semiconductor element 104B included in the chip 10-2 can be electrically operated at the same time. Alternatively, the electric signal may be supplied to the electrode P1 of the chip 10-2 connected to the wire L12.

For example, if non-volatile memory devices are used for the semiconductor elements 104A and 104B, chip IDs can be collectively written in the adjacent two chips 10-1 and 10-2. A fuse element or an anti-fuse element may be used for the non-volatile memory device, for example.

That is, by forming multiple chips 10 of this exemplary embodiment over the wafer 1, electrical operations (write operation of chip IDs or the like) of different contents for each chip can be collectively performed by the unit of multiple chips.

Further, in the abovementioned technique disclosed by AOKI, in order to provide a unique ID to each chip exceeding the number of chips printable in one shot, a combination of masks, each with different number of printing chips in one shot, must be inevitably prepared. Therefore, there is a problem that it is costly to create the masks. On the other hand, this exemplary embodiment has an exemplary advantage that the pattern concerning the wires L11 and L12 may be printed to the usual mask for forming wires, thus it is not necessary to prepare the combination of masks, each with different number of printing chips in one shot.

Note that FIGS. 2 and 3 illustrate an example of providing two wires L11 and L12 as wires contacting at least one of the left side S1 and the right side S2 of the chip 10, and connecting to wires of another chip 10, which is adjacent to the previously mentioned chip 10 in the wafer. However, the number of wires formed over the principal surface 108 of the chip 10 for the purpose of connecting between adjacent chips may be three or more. These wires may be provided in the vertical direction of the chip 10. The specific number of wires may be determined according to the number of chips included in the wafer 1, and the number of chips to perform an electrical operation thereto at the same time. For example, if there are maximum of six chips 10 in the vertical direction of the wafer 1, and maximum of six chips 10 in the horizontal direction of the wafer 1, at least six wires in the vertical direction and at least six wires in the horizontal direction may be placed in each chip 1. Specific examples of providing three or more wires are described in detail in the following second to fifth exemplary embodiments.

FIG. 3 illustrates a specific example of a wafer including multiple chips 10 having the same layout (wiring pattern) of the wires L11 and L12 placed to be adjacent. That is, in the example of FIG. 3, the wiring pattern of the wires L11 and L12 is repeated by each chip. However, the repeating cycle of the wiring pattern may be by the unit of multiple chips. In this case, the repeating cycle of the wiring pattern may be determined according to the number of printing chips in one shot in the lithography process. A specific example of setting the repeating cycle of the wiring pattern to multiple chips is described in detail in a sixth exemplary embodiment.

[Second Exemplary Embodiment]

Figure 4:
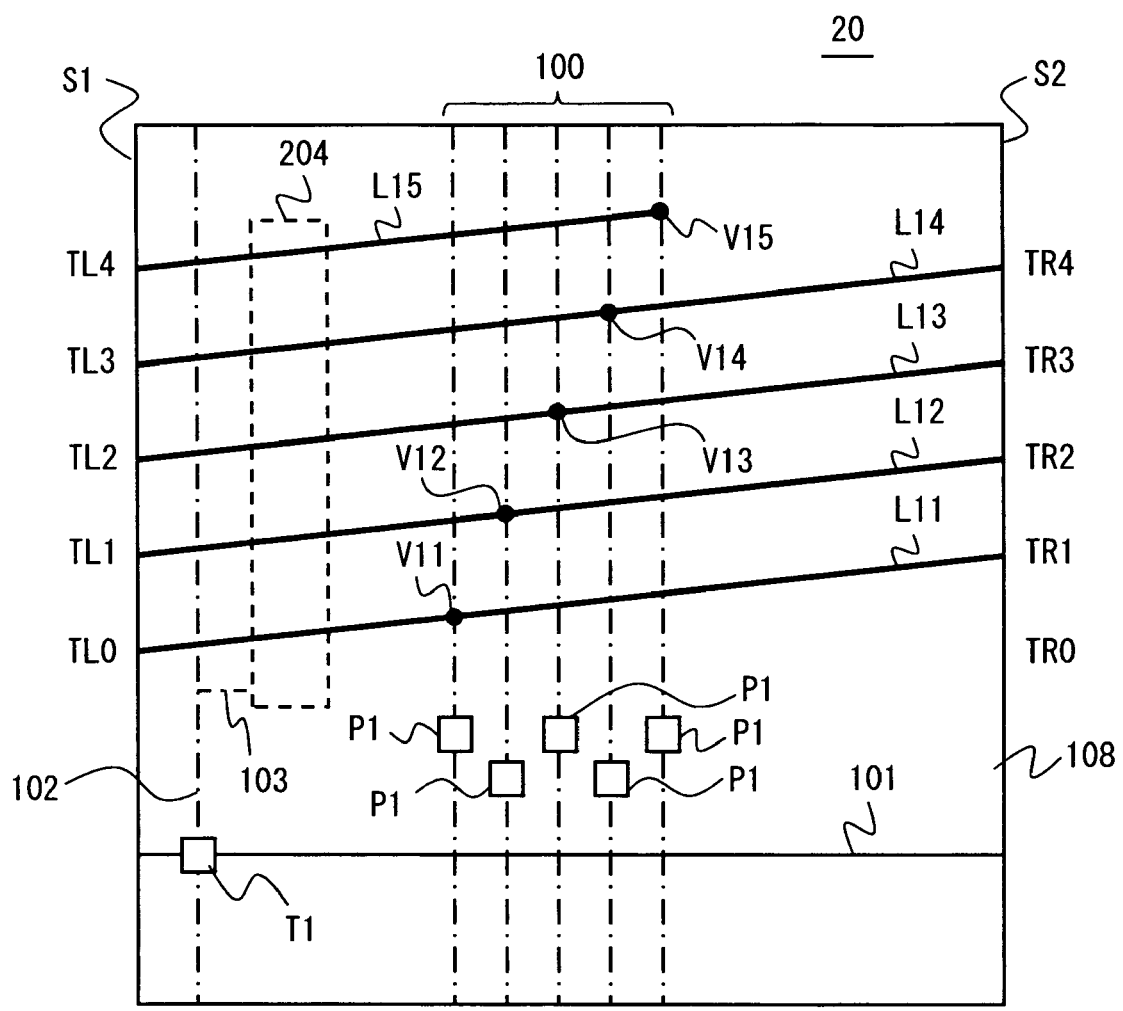
FIG. 4 is a plan view of a semiconductor chip according to a second exemplary embodiment.

FIG. 4 is a plan view illustrating a configuration example of a semiconductor chip 20 according to this exemplary embodiment. Wires L11 to L15 are formed in one of the wiring layers provided to the rectangle principal surface 108 of the chip 20, for example in the top wiring layer (nth layer). Among the above wires, the wires L11 to L14 are formed from the left side S1 to reach the right side S2 of the chip 20. Further, the wire L15 contact at least the left side S1, and extends over the principal surface 108. The wire L15 may be formed from the left side S1 to reach the right side S2.

An edge part TR1 of the wire L11 on the right side S2 and an edge part TL1 of the wire L12 on the left side S1 are placed to oppose each other. In other words, the edge parts TR1 and TL1 are placed to substantially position on the common straight line, which is vertical to the left and right side S1 and S2. Similarly, an edge part TR2 of the wire L12 on the right side S2 and an edge part TL2 of the wire L13 on the left side S1 are placed to substantially position on a common straight line, which is vertical to the sides S1 and S2. Further, an edge part TR3 of the wire L13 on the right side S2 and an edge part TL3 of the wire L14 on the left side S1 are placed to substantially position over a common straight line, which is vertical to the sides S1 and S2. Moreover, an edge part TR4 of the wire L14 on the right side S2 and an edge part TL4 of the wire L15 on the left side S1 are placed to substantially position over a common straight line, which is vertical to the sides S1 and S2.

Five electrodes P1 supply an electric signal to the wires L11 to L15. The five electrodes P1 are placed on the surface of the chip 10, and are connected to the wires 100 by plugs or the like which are embedded in via-holes formed in an interlayer film. The wires 100 are formed in a wiring layer different from the wires L11 to L15 (for example, (n−1)th layer), and are connected to the wires L11 to L15 by plugs V11 to V15. Note that the electrode P1 is not necessarily provided to all the chips 20 existing in the same wafer, but may be provided to only some of the chips 20.

A semiconductor circuit 204 includes multiple non-volatile memory devices for storing chip IDs. Suppose that the non-volatile memory device is a fuse element, as an example in this explanation. An electrode T1 is supplied with a control signal for controlling the write operation of chip IDs in the non-volatile memory devices in the semiconductor circuit 204. The electrode T1 is connected to the wires 101 and 102, so that if multiple chips 20 are placed to be adjacent in a wafer, the electrodes T1 in all the multiple chips 20 have the same potential. The wire 101 passes through the chip 20 in the horizontal direction of FIG. 4. The wire 102 passes through the chip 20 in the vertical direction of FIG. 4. In the example of FIG. 4, the wire 101 is formed in the same wiring layer as the wires L11 to L15, and the wire 102 is formed in the same wiring layer as the wires 100. The semiconductor circuit 204 is connected to the wire 102 by a wire 103.

Figure 5:
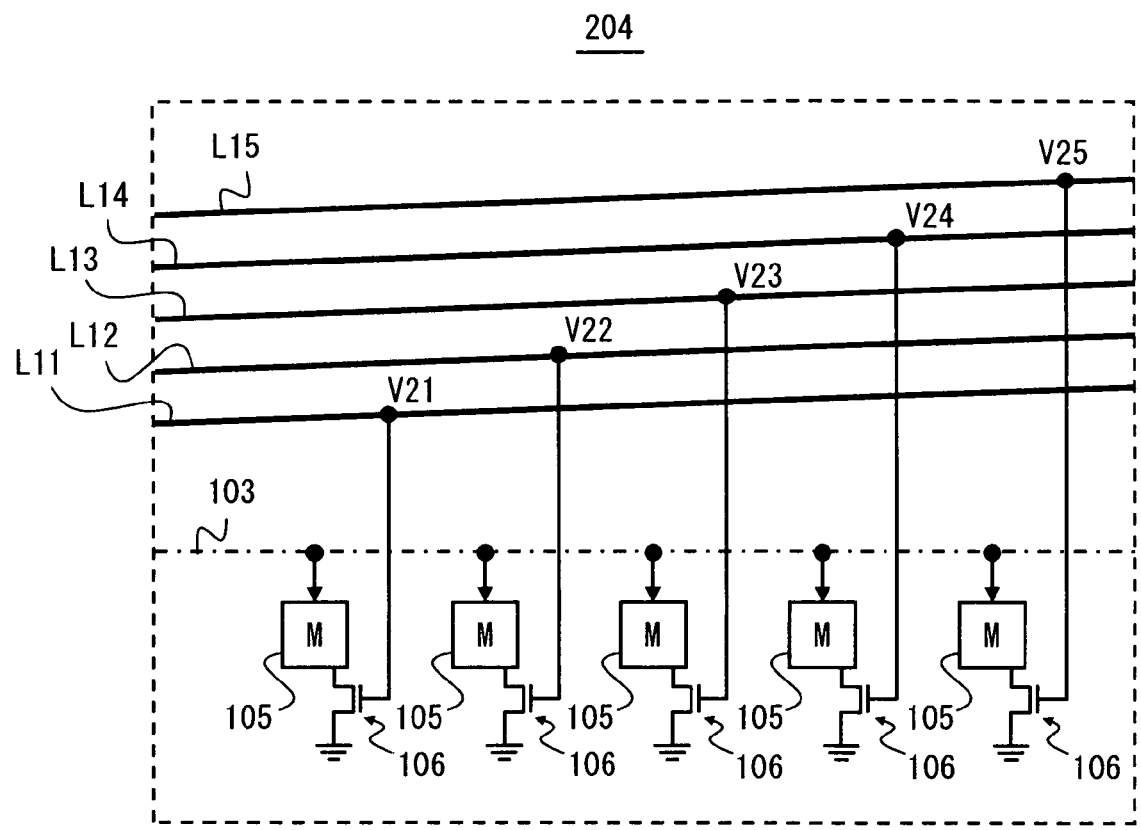
FIG. 5 illustrates a configuration example of a memory circuit included in the semiconductor chip of FIG. 4.

FIG. 5 is a block diagram illustrating a configuration example of the semiconductor circuit 204. Each of five fuse elements 105 is coupled to one of the wires L11 to L15 via a switch transistor 106. The procedure to specify the storage content to the fuse element 105 is described hereinafter. For example, the corresponding switch transistor 106 is turned on by applying a voltage from the electrode P1 to the wire L11. By operating the electrode T1 for write control in this state, the fuse element 105 corresponding to the wire L11 is disconnected, and the storage content is determined. That is, by determining the voltage applied state of the five wires L11 to L15 according to the X coordinate of the chip 20, the X coordinate of the chip 20 in the wafer surface can be recorded to the five fuse elements as a chip ID.

Next, the write procedure of a chip ID in the chip 20 is described with reference to FIGS. 6A and 6B. FIG. 6A illustrates a part of a wafer including five chips 20-1 to 20-5 placed to be adjacent. If a voltage is applied to the five electrodes P1 (surrounded by a circle 70) of the rightmost chip 20-5, the number of wires applied with a voltage is different among the chips 20-1 to 20-5. To be more specific, as illustrated in FIG. 6B, in the rightmost chip 20-5, a voltage is applied to the five wires L11 to L15. In the next chip 20-4, a voltage is applied to the four wires L11 to L14. In order, a voltage is applied to the three wires L11 to L13 in the chip 20-3, two wires L11 and L12 in the chip 20-2, and one wire L11 in the chip 20-1. If one of the electrodes T1 (for example the electrode T1 indicated by a circle 71) in the chips 20-1 to 20-5 is operated in such asymmetrical voltage applied state, different X coordinates are recorded as chip IDs in the five semiconductor circuits 204 included in the chips 20-1 to 20-5.

Figure 7:
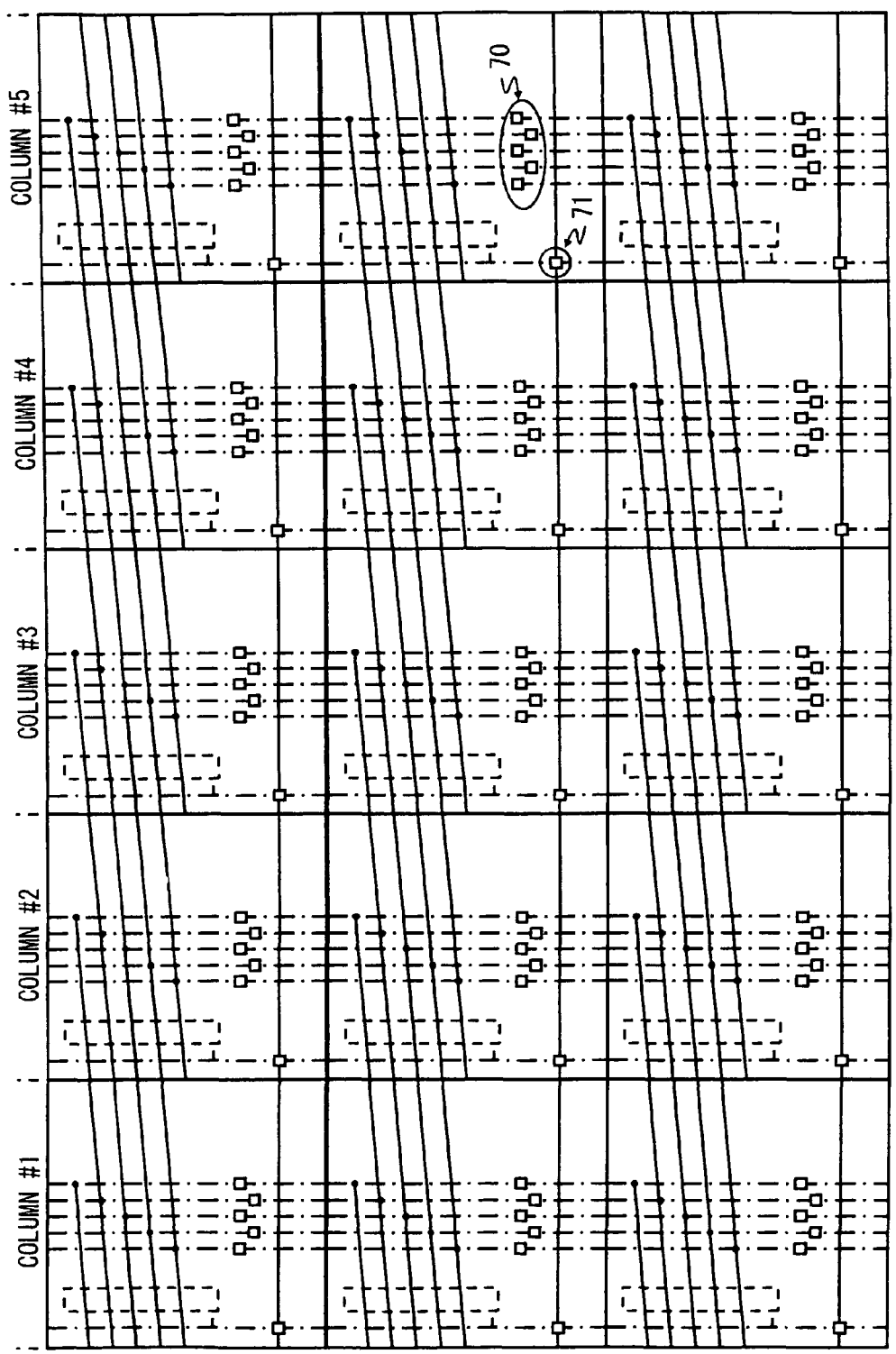
FIG. 7 illustrates an arrangement of a wafer in which the semiconductor chips of FIG. 4 are adjacent in the horizontal and the vertical directions.

FIG. 7 illustrates an example of repeatedly placing the configuration of FIGS. 6A and 6B further in the vertical direction. In the configuration of FIG. 7, the wires 100 in the vertical direction connect chips above and below. Therefore, by applying a voltage to the five electrodes P1 (five electrodes T1 indicated by the circle 70, for example) included in one of the rightmost fifth column chips, it is possible to write X coordinates in all the chips in FIG. 7.

[Third Exemplary Embodiment]

Figure 8:
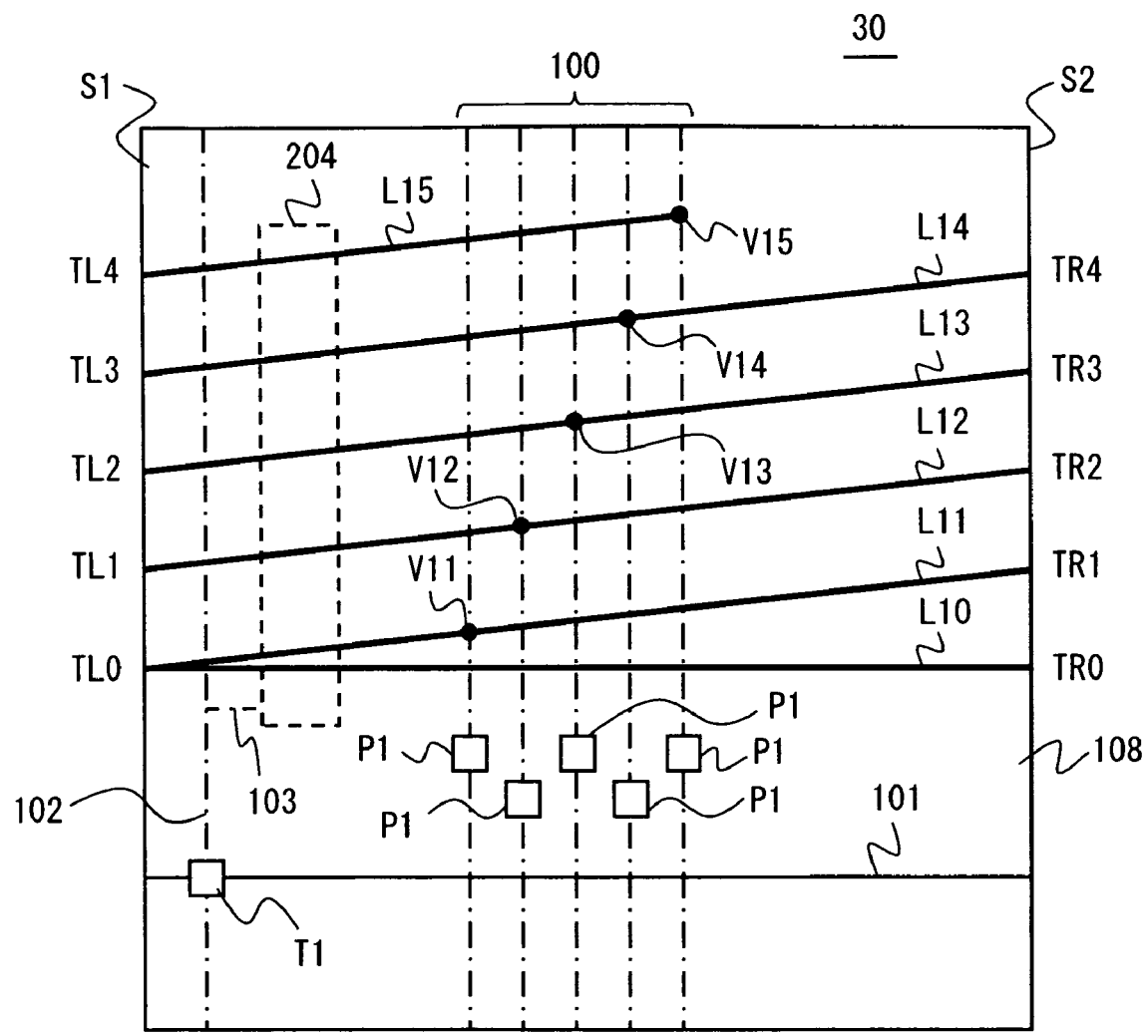
FIG. 8 is a plan view of a semiconductor chip according to a third exemplary embodiment.

A semiconductor chip 30 according to this exemplary embodiment is a modification of the abovementioned chip 20. FIG. 8 is a plan view illustrating a configuration example of the chip 30. The chip 30 further includes a wire L10 in addition to all the components of the chip 20 illustrated in FIG. 4. The wire L10 is formed in the same wiring layer as the wires L11 to L15. Further, the wire L10 extends from a point TL0 on the side S1 to a point TR0 on the side S2, and is connected to the wire L11 on the principal surface 108 of the chip 30.

Figure 9A:
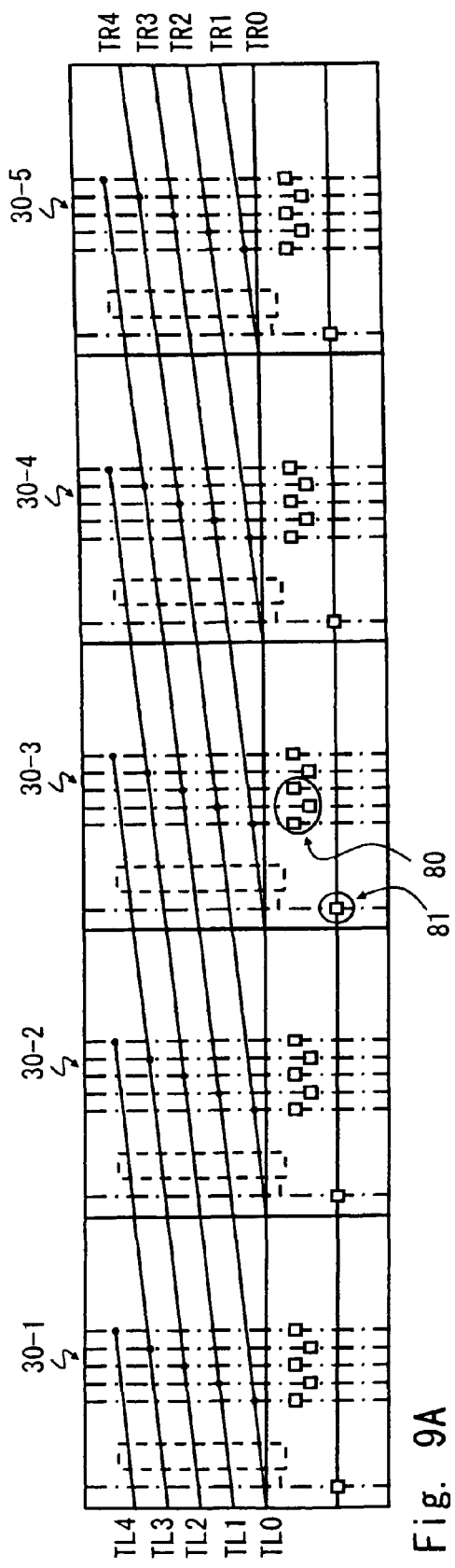
FIGS. 9A and 9B illustrate an arrangement of a wafer in which multiple semiconductor chips of FIG. 8 are adjacent in the horizontal direction.
Figure 9B:
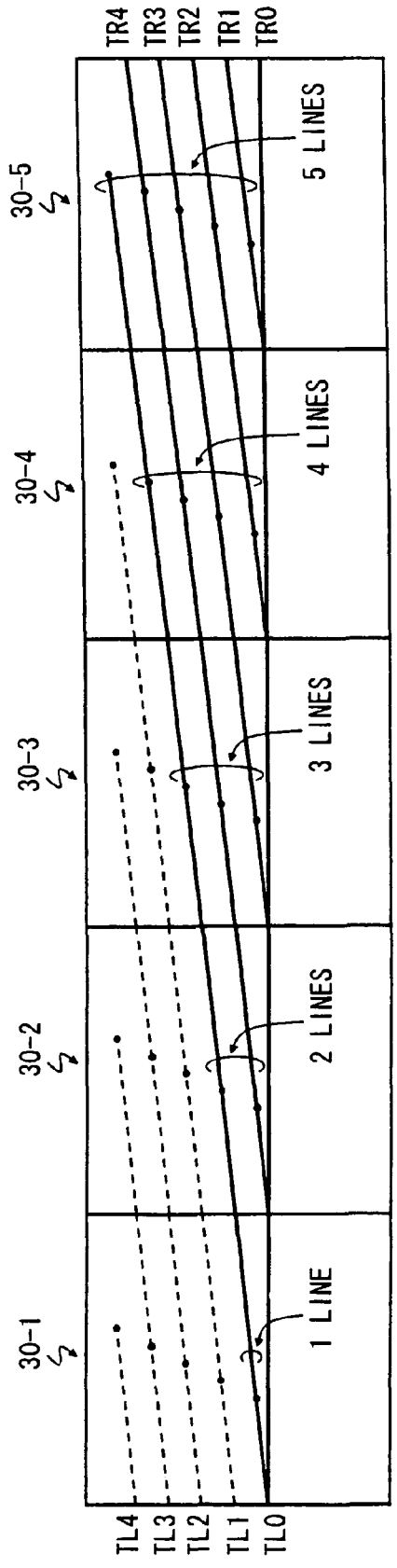

Next, the write procedure of chip IDs in the multiple chips 30 is explained with reference to FIGS. 9A and 9B. FIG. 9A illustrates a part of the wafer including five chips 30-1 to 30-5 placed to be adjacent. If a voltage is applied to at least one of the three electrodes P1 (surrounded by a circle 80) included in the central chip 30-3, the number of wires applied with a voltage is different among the chips 30-1 to 30-5. Specifically, as illustrated in FIG. 9B, a voltage is applied to the five wires L11 to L15 in the rightmost chip 30-5. In the next chip 30-4, a voltage is applied to the four wires L11 to L14. In order, a voltage is applied to the three wires L11 to L13 in the chip 30-3, two wires L11 and L12 in the chip 30-2, and one wire L11 in the chip 30-1. In addition to these wires, a voltage is applied to the wire L10 in each chip. If one of the electrodes T1 (for example the electrode T1 indicated by a circle 81) in the chips 30-1 to 30-5 is operated in such asymmetrical voltage applied state, different X coordinates are recorded as chip IDs to the five semiconductor circuits 204 included in the chips 30-1 to 30-5.

Figure 10:
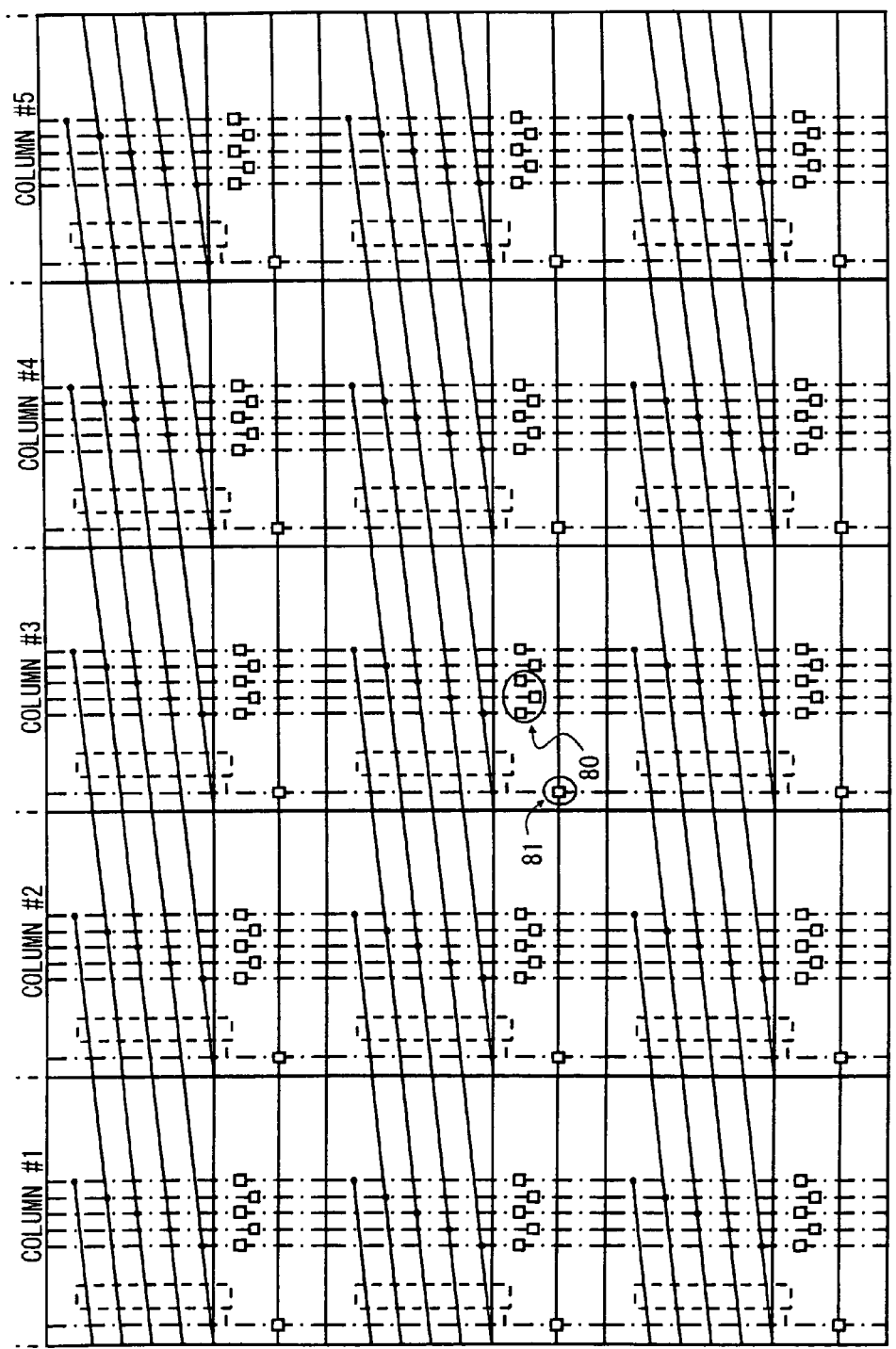
FIG. 10 illustrates an arrangement of a wafer in which the semiconductor chips of FIG. 8 are adjacent in the horizontal and the vertical directions.

FIG. 10 illustrates an example of repeatedly placing the configuration of FIGS. 9A and 9B further in the vertical direction. In the configuration of FIG. 10, the wires 100 in the vertical direction connect chips above and below. Therefore, by applying a voltage to at least one electrode P1 (one of the three electrodes P1 indicated by the circle 80, for example) included in one of the central third column chips, it is possible to write X coordinates in all the chips in FIG. 10.

An exemplary advantage of the chip 30 of this exemplary embodiment over the abovementioned chip 20 is that the number of the electrode P1 to apply a voltage for recording the X coordinates may be at least one. Another exemplary advantage is that the asymmetrical voltage applied state of FIGS. 9A and 9B can be achieved by using any of the electrodes P1 in the chips 30-1 to 30-5. This improves the flexibility of the selection of the electrodes P1 to apply a voltage thereto. For example, as illustrated in FIGS. 6A and 7, in order to apply a voltage from the endmost chip of the wafer, it is necessary to set the voltage to be higher in consideration of a voltage drop. On the other hand, as illustrated in FIGS. 9A and 10, by selecting the electrode P1 of the chip near the center of the wafer and applying a voltage thereto, it is possible to efficiently apply a desired voltage to the entire wafer with a lower voltage.

[Fourth Exemplary Embodiment]

Figure 11:
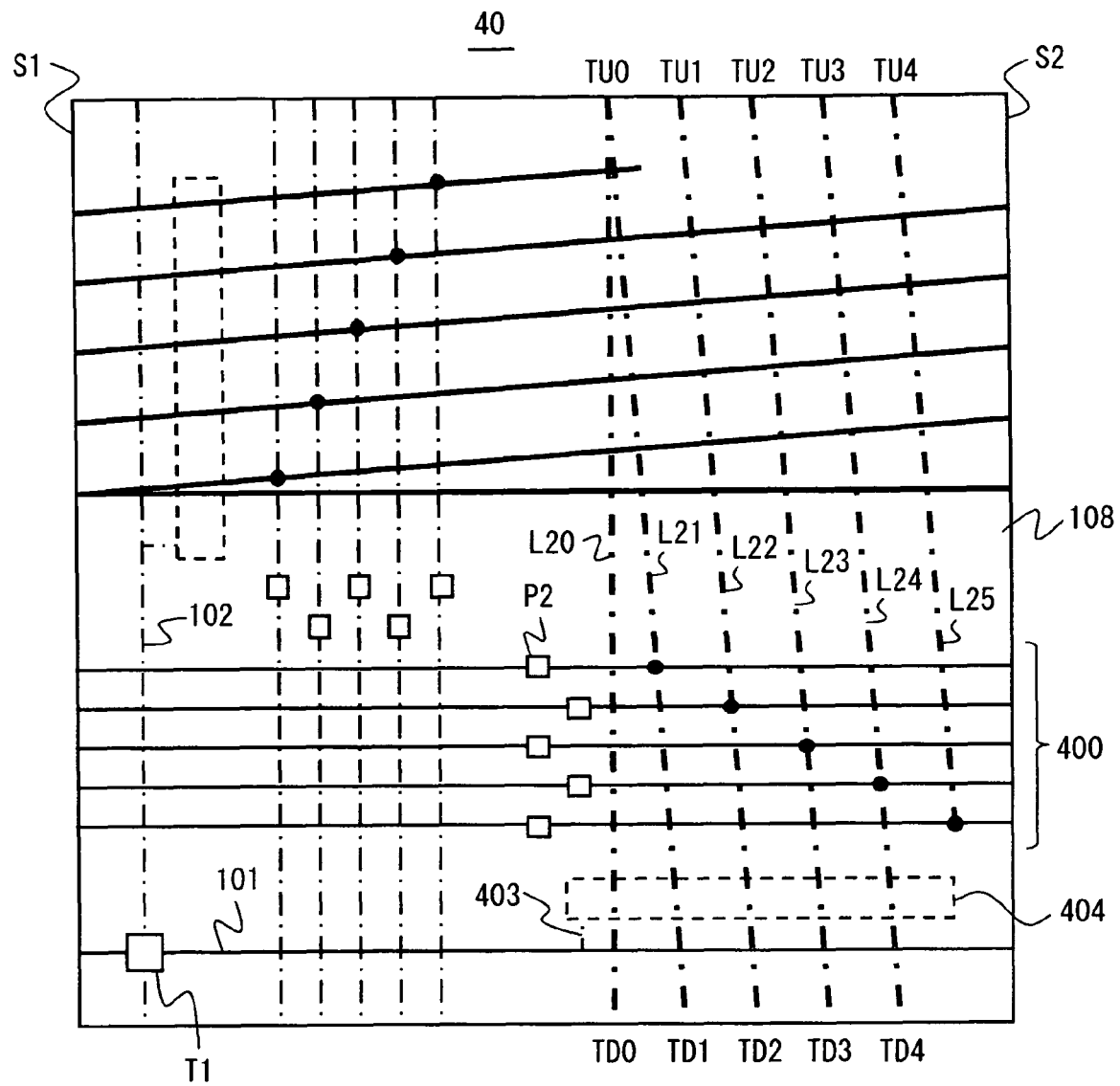
FIG. 11 is a plan view of a semiconductor chip according to a fourth exemplary embodiment.

FIG. 11 is a plan view illustrating a configuration example of a semiconductor chip 40 according to this exemplary embodiment. The chip 40 further includes the configuration to record Y coordinates in addition to the configuration of the chip 30 illustrated in FIG. 8 for recording X coordinates.

To be more specific, wires L20 to L25 extend in the vertical direction of the chip 40 for recording Y coordinates. That is, the wires L20 to L25 correspond to the wires L10 to L15 for recording X coordinates. The five electrodes P2 placed on the surface of the chip 40 are provided to supply a voltage to the wires L21 to L25, and connected to the wires L21 to L25 via wires 400. A semiconductor circuit 404 includes multiple non-volatile memory devices for storing chip IDs (specifically Y coordinates of the chips). Note that the specific configuration of the semiconductor circuit 404 may be the same as the abovementioned semiconductor circuit 204. The semiconductor circuit 404 is connected to the wire 101 via the wire 403.

The procedure to write Y coordinates in the wafer including the chips 40 of FIG. 11 placed repeatedly may be the same as the abovementioned write procedure of X coordinates, thus the explanation is omitted here. By placing the multiple chips 40 on the wafer so that the chips 40 are placed to be adjacent in up and down, and left and right, the operation of electrically writing different chip IDs (X and Y coordinates) in each chip can be collectively performed for all the chips.

[Fifth Exemplary Embodiment]

Figure 12:
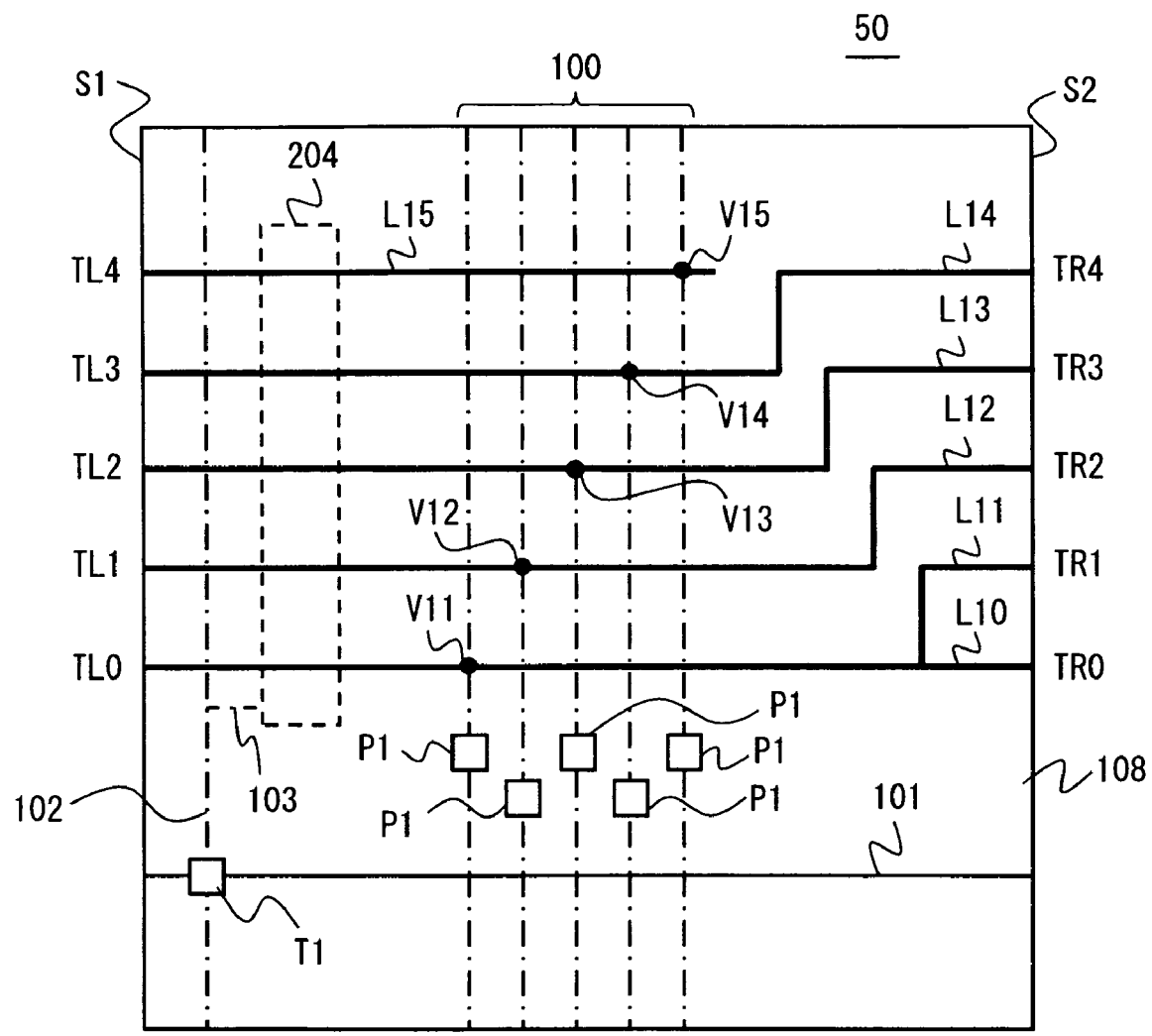
FIG. 12 is a plan view of a semiconductor chip according to a fifth exemplary embodiment.

In the abovementioned first to fourth exemplary embodiments, the wires L11 to L15 are explained to extend obliquely relative to the sides S1 and S2. However, these wires L11 to L15 are not necessarily oblique wires as long as the physical relationship of the edge parts over the left and right side S1 and S2 complies with the abovementioned rule. This applies to the wires L21 to L25 for recording Y coordinates. FIG. 12 is a plan view illustrating a configuration example of a chip 50 according to this exemplary embodiment. In the example of FIG. 12, the wires L11 to L15 are formed of combinations of wires vertical and parallel to the sides S1 and S2.

Figure 13A:
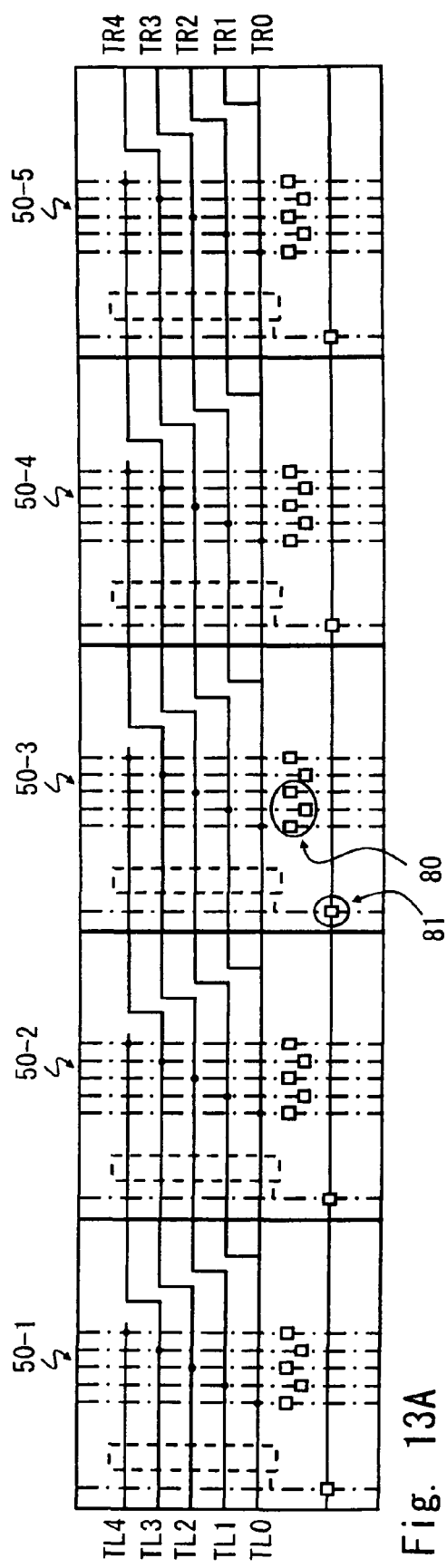
FIGS. 13A and 13B illustrate an arrangement of a wafer in which the semiconductor chips of FIG. 12 are adjacent in the horizontal direction.
Figure 13B:
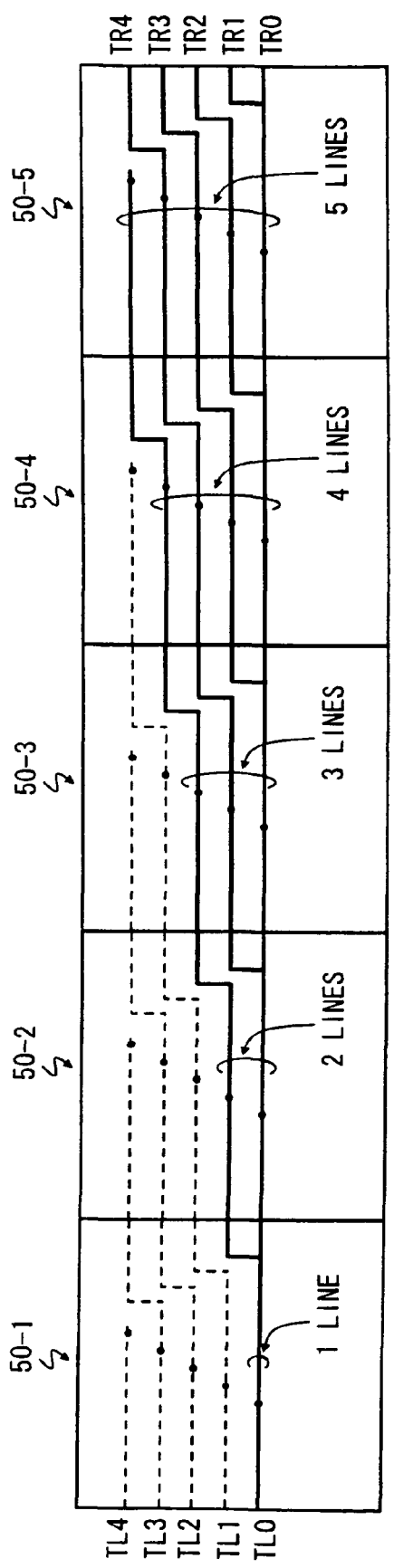

FIGS. 13A and 13B illustrate a part of a wafer including five chips 50-1 to 50-5 placed to be adjacent. If a voltage is applied to at least one of the three electrodes P1 (surrounded by a circle 80) included in the central chip 50-3, the number of wires applied with a voltage is different among the chips 50-1 to 50-5. If one electrode T1 (for example, the electrode T1 indicated by a circle 81) in the chips 50-1 to 50-5 is operated in such state, different X coordinates are recorded as chip IDs to the five semiconductor circuits 204 included in the chips 50-1 to 50-5.

[Sixth Exemplary Embodiment]

The first to fifth exemplary embodiments explained examples in which each of the multiple chips formed in the wafer surface includes the same layout (wiring pattern) of the wires L10 to L15 or L20 to L25. For example, FIGS. 6A and 6B illustrate an example in which the chips 20-1 to 20-5 having the same wiring pattern are formed over the wafer surface. However, the repeating cycle of the wiring pattern may be by the unit of multiple chips. In this case, the repeating cycle of the wiring pattern may be determined according to the number of printing chips in one shot in the lithography process. For example, in order to perform step-and-repeat exposure using a mask capable of collectively printing four chips of two rows by two columns, the repeating cycle of the wires L10 to L15 and L20 to L25 may be the unit of two chips. Further, when using a mask capable of collectively printing nine chips of three rows by three columns, the repeating cycle of the wires L10 to L15 and L20 to L25 may be the unit of three chips. Thus, the same exemplary advantages as the first to fifth exemplary embodiment can be achieved even when using the wiring pattern that repeats by the unit of multiple chips. This is explained with reference to FIGS. 14 to 16.

First, an example is explained, in which three-shot exposure is performed in the horizontal direction by step-and-repeat using the mask capable of collectively printing four chips of two rows by two columns. That is, the maximum number of chips in the horizontal direction of a wafer is six. A specific example of the chip formed as above is illustrated in FIGS. 14A and 14B.

Figure 14A:
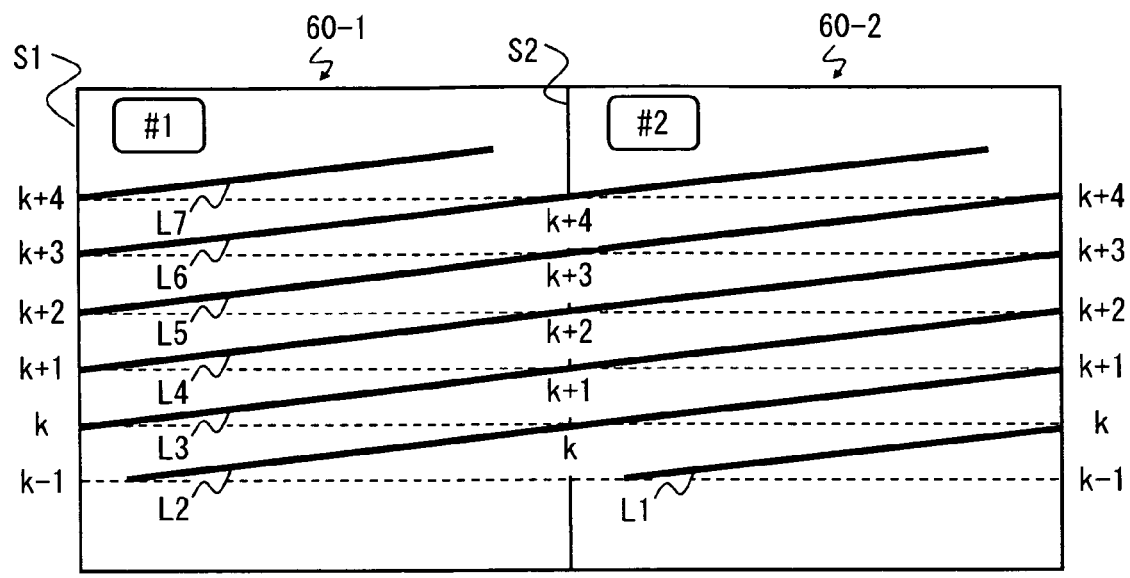
FIGS. 14A and 14B are plan views illustrating a part of semiconductor wafers according to a sixth exemplary embodiment.
Figure 14B:
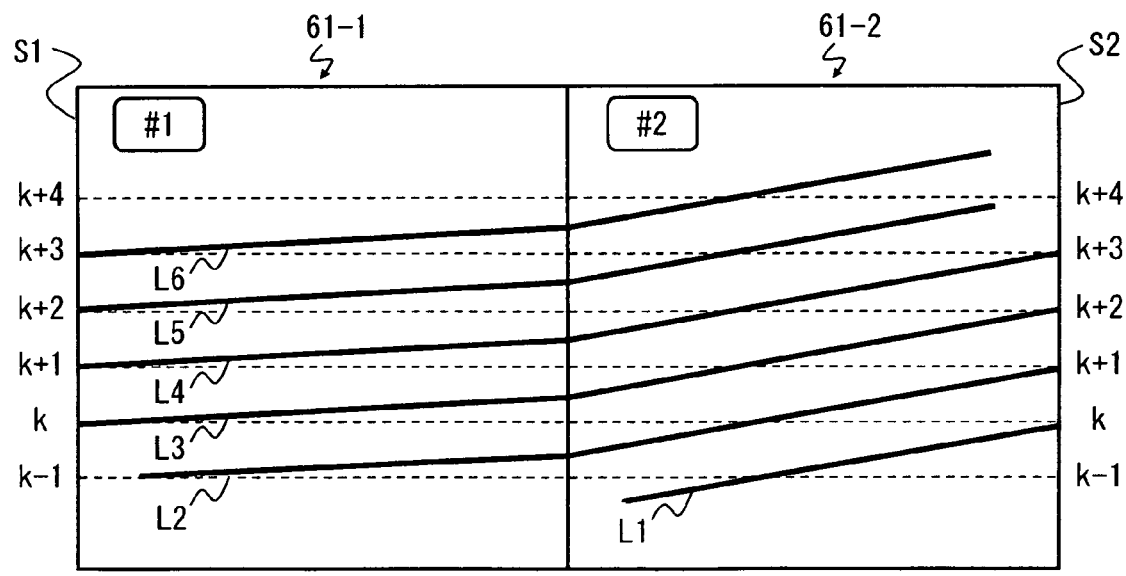

FIG. 14A illustrates two chips 60-1 and 60-2 which are adjacent in the horizontal direction on the wafer. The chips 60-1 and 60-2 include the wiring pattern repeated for each chip, in a similar way as described in the first to fifth exemplary embodiments. The characteristics of the seven wires L1 to L7 formed in the chips 60-1 and 60-2 are described hereinafter.

(1) The number of wires placed on the principal surface of one chip, which is the repeating cycle, and connected to semiconductor elements (not illustrated) formed in a lower layer semiconductor element layer is at least "six". The number of wires "six" corresponds to the maximum number of chips in the horizontal direction of the wafer. Specifically, the six wires L2 to L7 are placed on the principal surface of the chip 60-1. Each wire is connected to one of the six semiconductor elements (not illustrated) formed in the lower layer semiconductor element layer. The wire L1 does not exist on the principal surface of the chip 60-1. On the other hand, the six wires L1 to L6 are placed on the principal surface of the chip 60-2. Each wire is connected to one of the six semiconductor elements (not illustrated) formed in the lower layer semiconductor element layer. The wire L7 does not exist on the principal surface of the chip 60-2.

(2) Next, the total number of the wires L3 to L7 which contact the left side S1 of the left side chip 60-1 and also extend over the principal surface of the chip 60-1 is at least "five". Further, the total number of the wires L2 to L6 which contact the right side S2 of the right side chip 60-1 and extend over the principal surface of the chip 60-1 is also at least "five". The number of wires "five" here is the value obtained by subtracting the repeating unit "one" of the wiring pattern from the maximum number of chips in the horizontal direction of the wafer, "six". Accordingly, among the six wires L2 to L7 placed over the principal surface of the chip 60-1, at least four wires (that is the wires L3 to L6) are formed to penetrate from the left side S1 of the chip 60-1 through the right side S2 of the chip 60-1, that is, from one edge part through another edge part of the chip group (only the chip 60-1 in this example) included in the repeating cycle. The number of wires to penetrate, which is "four", is obtained by subtracting the double value of the repeating unit of the wiring pattern (which is two) from the maximum number of chips in the horizontal direction of the wafer, which is "six".

(3) Further, the edge positions (k to k+4) of the five wires L3 to L7 contacting the left side S1 of the chip 60-1 correspond to the edge positions (k to k+4) of the five wires L2 to L6 contacting the right side S2 of the chip 60-1. In other words, an edge part of each wire on the left side S1 opposes an edge part that belongs to one of the wires, which is different from the previously mentioned wire, among the edge parts of the wires on the right side S2. Specifically, the edge position k of the wire L3 on the left side S1 of the chip 60-1 is placed substantially position on a common straight line with the edge position k of the wire L2 on the right side S2 of the chip 60-1.

By complying with the wiring pattern rules (1) to (3) described above, it is possible to form a wiring pattern in which at least one wire is continuous periodically over the entire horizontal direction of the wafer. The rule for forming the wiring pattern that repeats by the unit of one chip may be expanded to the cycle of multiple chips.

FIG. 14B illustrates two chips 61-1 and 61-2 which are adjacent in the horizontal direction on the wafer. The chips 61-1 and 61-2 include the wiring pattern repeated by each two chips. The characteristics of the six wires L1 to L6 formed in the chips 60-1 and 60-2 are described hereinafter.

(1a) The total number of the wires L1 to L6 placed on the principal surface of the two chips (61-1 and 61-2), which is the repeating cycle, is at least "six". The number of wires "six" corresponds to the maximum number of chips in the horizontal direction of the wafer.

(2a) Next, the total number of the wires L3 to L6 contacting the left side S1 of the left chip 61-1 between the two chips included in the repeating cycle is at least "four". The total number of the wires L1 to L4 contacting the right side S2 of the rightmost chip 61-2 between the two chips is also "four". The number of wires "four" here is the value obtained by subtracting the repeating unit "two" of the wiring pattern from the maximum number of chips in the horizontal direction of the wafer, "six". Accordingly, among the six wires L1 to L6, at least two wires (which is the wires L3 and L4) are formed to penetrate from the left side S1 of the leftmost chip 61-1 through the right side S2 of the rightmost chip 61-2, that is, from one edge part through another edge part of the chip group included in the repeating cycle. The number of wires to penetrate, which is "two", is obtained by subtracting the double value of the repeating unit of the wiring pattern (which is four) from the maximum number of chips in the horizontal direction of the wafer, "six".

Specifically, all of the four wires L3 to L6 contacting the left side S1 of the leftmost chip 61-1 are extended over the principal surface of the chip 61-2, and connected to one of the semiconductor elements (not illustrated) formed in the lower layer semiconductor element layer in the principal surface of each chip.

On the other hand, the four wires L1 to L4 contacting the right side S2 of the rightmost chip 61-2 are formed in a way that the farther the wires are from the rightmost chip 61-2, the less number of wires connected to the lower layer semiconductor element, where the number of wire decrements by one. At least one of the wires L1 to L4 extends over the principal surface of the leftmost chip 61-1.

To be more specific, among the four wires L1 to L4 contacting the right side S2 of the chip 61-2, "all of the four" wires extend over the principal surface of the rightmost chip 61-2. Each of the four wires is connected to the lower layer semiconductor element (not illustrated). Then, among the four wires L1 to L4 contacting the right side S2 of the chip 61-2, "three" wires L2 to L4 extend over the principal surface of the leftmost chip 61-1. Each of the three wires is connected to the lower layer semiconductor element (not illustrated).

The above rules (1a) and (2a) lead to the following statements. At least six wires (L1 to L6) are placed over the principal surface of the rightmost chip 61-2 between the two chips, which is the repeating cycle. Each wire is connected to one of the six semiconductor elements (not illustrated) formed in the lower layer semiconductor element layer. Moreover, at least five wires (L2 to L6) are placed over the principal surface of the leftmost chip 61-2 between the two chips, which is the repeating cycle. Each wire is connected to one of the five semiconductor elements (not illustrated) formed in the lower layer semiconductor element layer.

(3a) Further, the edge positions (k to k+3) of the four wires L3 to L6 contacting the left side S1 of the leftmost chip 61-1 correspond to the edge positions (k to k+3) of the four wires L1 to L4 contacting the right side S2 of the rightmost chip 61-2. In other words, an edge part of each wire on the left side S1 of the leftmost chip 61-1 opposes an edge part that belongs to one of the wires, which is different from the previously mentioned wire, among the edge parts of the wires on the right side S2 of the rightmost chip 61-2. Specifically, an edge position k of the wire L3 on the left side S1 of the leftmost chip 61-1 is placed substantially position on a common straight line with an edge position k of the wire L1 on the right side S2 of the rightmost chip 61-2, for example.

Figure 15A:
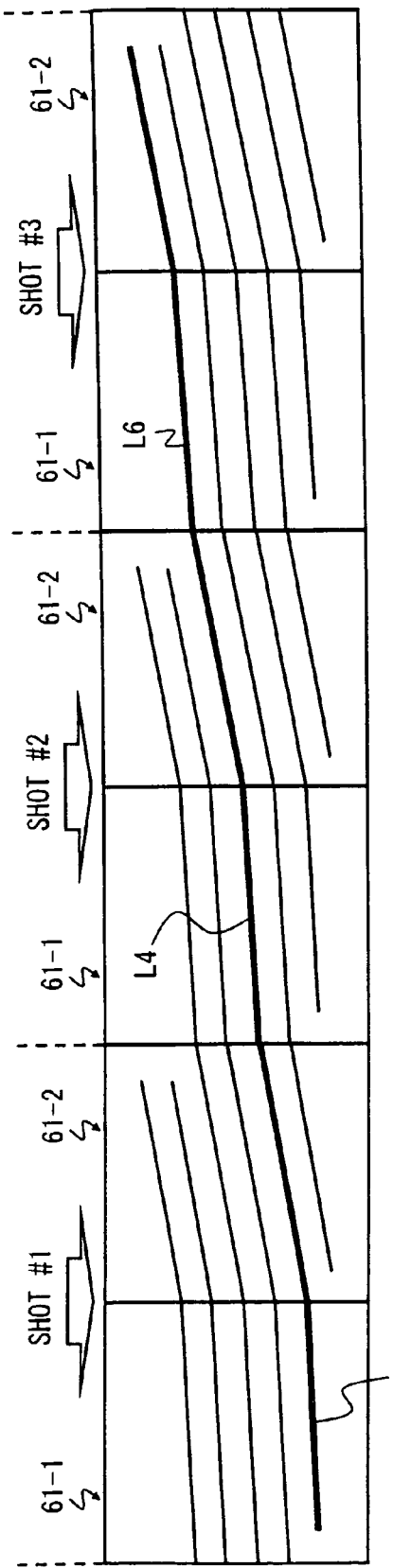
FIG. 15A is a plan view illustrating a wider range of the semiconductor wafer of FIG. 14B.
Figure 15B:
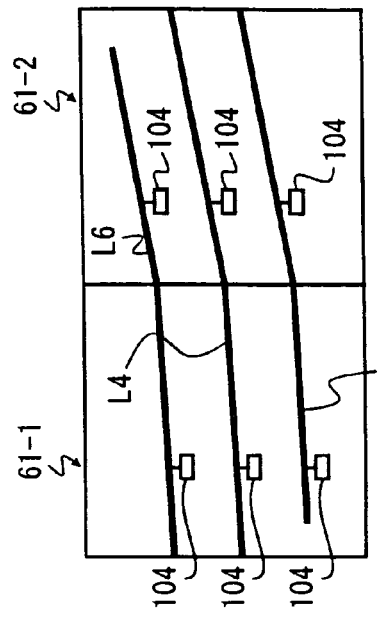
FIGS. 15B and 15C illustrate modifications of the semiconductor wafer of FIG. 14B.
Figure 15C:
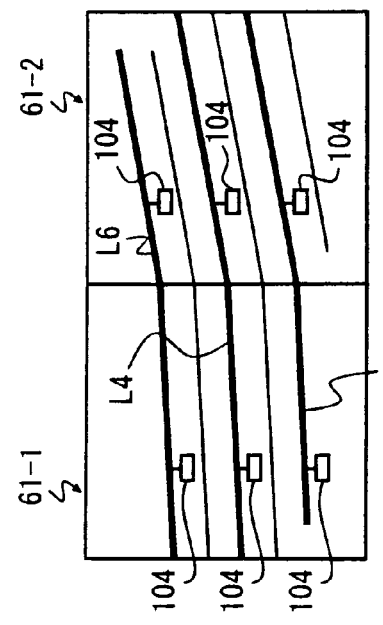

FIG. 15A illustrates a wafer formed by performing three-shot step-and-repeat exposure using the mask including the wiring pattern of FIG. 14B. FIG. 15A illustrates the total of six chips in the entire horizontal direction of the wafer. By complying with the wiring pattern rules (1a) to (3a) described above, as illustrated in FIG. 15A, it is possible to form a wiring pattern in which at least one wire is continuous periodically over the entire horizontal direction of the wafer. The continuous wire (indicated by the thick solid wire in FIG. 15A) formed by coupling the wires L2, L4, and L6 enables to collectively write different X coordinates in the six chips. Note that in this case, it is not necessary to connect all the wires over the principal surface of each chip to the semiconductor element, but only the wires L2, L4, and L6 may be connected to the semiconductor element 104. FIG. 15B illustrates the status of this shot unit. As an expanded state, the wiring pattern may include only the wires L2, L4, and L6. FIG. 15C illustrates the status of this shot unit.

Further, as described with reference to FIGS. 6A and 6B, the semiconductor element may be connected to all the wires L1 to L6, and a voltage is supplied to the six wires of the rightmost chip (the chip 61-2 obtained in the third shot) of FIG. 15A. This method also enables to collectively write different X coordinates in each of the six chips, as the number of wires applied with a voltage differs among the six chips of FIG. 15A.

The following rules (1b) to (3b) can be obtained by generalizing the abovementioned rules (1) to (3) and (1a) to (3a). Note that in the explanation relating the rules (1b) to (3b), the total number of chips placed to be adjacent in one direction (horizontal direction for example) shall be "m", and the repeating cycle of the wiring pattern is the unit of "n" chips. Suppose the case of performing two or more step-and-repeat exposure processes in the horizontal direction, then n may be an integer from one to m/2. Further, the number of chip included in the repeating cycle from right shall be "q". The rightmost chip number q is equal to "1", and the leftmost chip number q is equal to "n."

(1b) The total number of the wires placed on the principal surface of n number of chips included in the repeating cycle, is at least "m".

(2b) Next, the number of the wires contacting the left side S1 among n number of chips included in the repeating cycle is at least "(m−n)". Further, the number of the wires contacting the rightmost side S2 among n number of chips included in the repeating cycle is also at least "(m−n)". Accordingly, at least (m−n) number of wires among m number of wires are formed to penetrate from one edge part through another edge part in n number of chips group included in the repeating cycle.

Moreover, all of (m−n) number of wires contacting the left side S1 of the leftmost chip extend over the principal surface of the rightmost chip, and are connected to one of the semiconductor elements formed in the lower layer semiconductor element layer in the principal surface of each chip.

On the other hand, (m−n) number of wires contacting the right side S2 of the rightmost chip are formed so that the farther the wires are from the rightmost chip, the less the number of wires connected to the lower layer semiconductor element. At least one of the wires extends over the principal surface of the leftmost chip. For example, among (m−n) number of wires contacting the right side S2 of the rightmost chip, the number of wires connecting the lower layer semiconductor element over the principal surface of each chip is (m−n−(q−1)).

The above rules (1b) and (2b) lead to the following statements. At least (m−q+1) number of wires are placed over the principal surface of the qth chip from rightmost chip of n number of chips, which is the repeating cycle. Each wire is connected to one of (m−q+1) number of semiconductor elements (not illustrated) formed in the lower layer semiconductor element layer.

(3b) Further, the edge positions (k to (k+m−n−1)) of (m−n) number of wires contacting the left side S1 of the leftmost chip correspond to the edge positions (k to (k+m−n−1)) of (m−n) number of wires contacting the right side S2 of, the rightmost chip. In other words, an edge part of each wire on the left side S1 of the leftmost chip opposes an edge part that belongs to one of the wires, which is different from the previously mentioned wire, among the edge parts of wires on the right side S2 of the rightmost chip.

Figure 16:
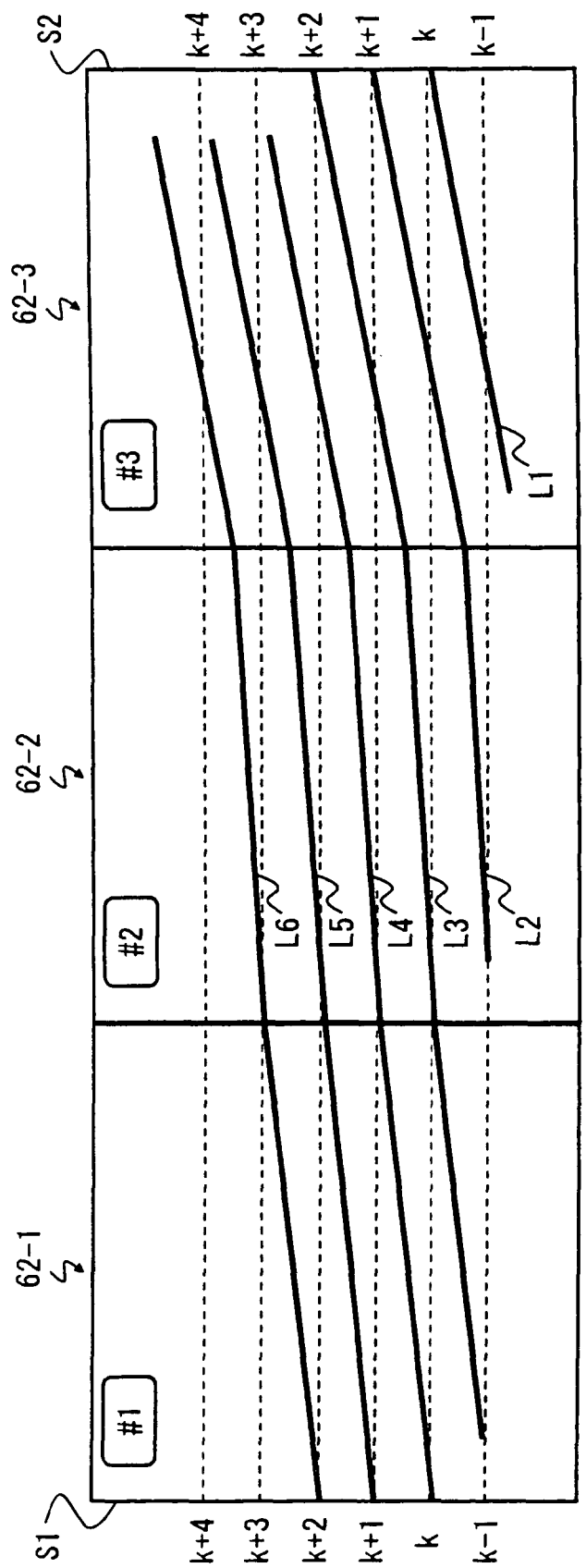
FIG. 16 is a plan view of another example of a semiconductor wafer according to the sixth exemplary embodiment.

FIG. 16 illustrates an example of applying the abovementioned rules (1b) to (3b) to the case of m=6 and n=3. First, if the rule (1b) is applied, the total number of the wires L1 to L6 placed on the principal surfaces of the three chips 62-1 to 62-3, which is the repeating cycle, is at least "six".

Next, if the rule (2b) is applied, the number of wires L4 to L6 contacting the left side S1 of the leftmost chip 62-1 among the three chips 62-1 to 62-3 included in the repeating cycle is at least "three". Further, the number of the wires L1 to L3 contacting the right side S2 of the rightmost chip 62-3 is also at least "three". Note that if m=6 and n=3, (m−2n) is zero. That is, as illustrated in FIG. 16, the number of wires formed to penetrate from one edge part (the left side S1 of the chip 62-1) to another edge part (right side S2 of the chip 62-3) of the three chips 62-1 to 62-3 may be zero as illustrated in FIG. 16.

Further, all the three wires L4 to L6 contacting the left side S1 of the leftmost chip 62-1 extend over the principal surface of the rightmost chip 62-3, and are also connected to one of the semiconductor elements (not illustrated) formed in the lower layer semiconductor element layer in the principal surface of each chip.

On the other hand, the number of the three wires L1 to L3 contacting the right side S2 of the rightmost chip 62-3 is formed so that the farther the wires are from the rightmost chip 62-3, the less number of wires connected to the lower layer semiconductor element (the number of wires decrements by one in FIG. 16). At least one of the wires L1 to L3 extends over the principal surface of the leftmost chip 62-1.

To be more specific, among the three wires L1 to L3 contacting the right side S2 of the rightmost chip 62-3, "all of the three" wires extend over the principal surface of the rightmost chip 62-3. Each of the three wires is connected to the lower layer semiconductor element (not illustrated). Then, among the wires L1 to L3, "two" wires L2 and L3 extend over the principal surface of the second chip 62-2 from right. Each of the wires L2 and L3 is connected to the lower layer semiconductor element (not illustrated). Moreover, among the wires L1 to L3, "one" wire L3 extends over the principal surface of the third chip from right 62-1 (which is the leftmost chip), and one wire L1 is connected to the lower layer semiconductor element (not illustrated).

The rules (1b) and (2b) further lead to the following statements. At least six wires (L1 to L6) are placed on the principal surface of the first chip 62-3 from the rightmost of the three chips, which is the repeating cycle. Each wire is connected to one of the six semiconductor elements (not illustrated) formed in the lower layer semiconductor element layer. Further, at least five wires (L2 to L6) are placed on the principal surface of the second chip 62-2 from the rightmost of the repeating cycle. Each wire is connected to one of the five semiconductor elements (not illustrated) formed in the lower layer semiconductor element layer. Furthermore, at least four wires (L3 to L6) are placed on the principal surface of the third chip 62-1 from the rightmost of the repeating cycle. Each wire is connected to one of the four semiconductor elements (not illustrated) formed in the lower layer semiconductor element layer.

Furthermore, the edge positions (k to (k+2)) of the three wires contacting the left side S1 of the leftmost chip 62-1 correspond to the edge positions of (k to (k+2)) of the three wires contacting the right side S2 of the rightmost chip 62-3.

Figure 17:
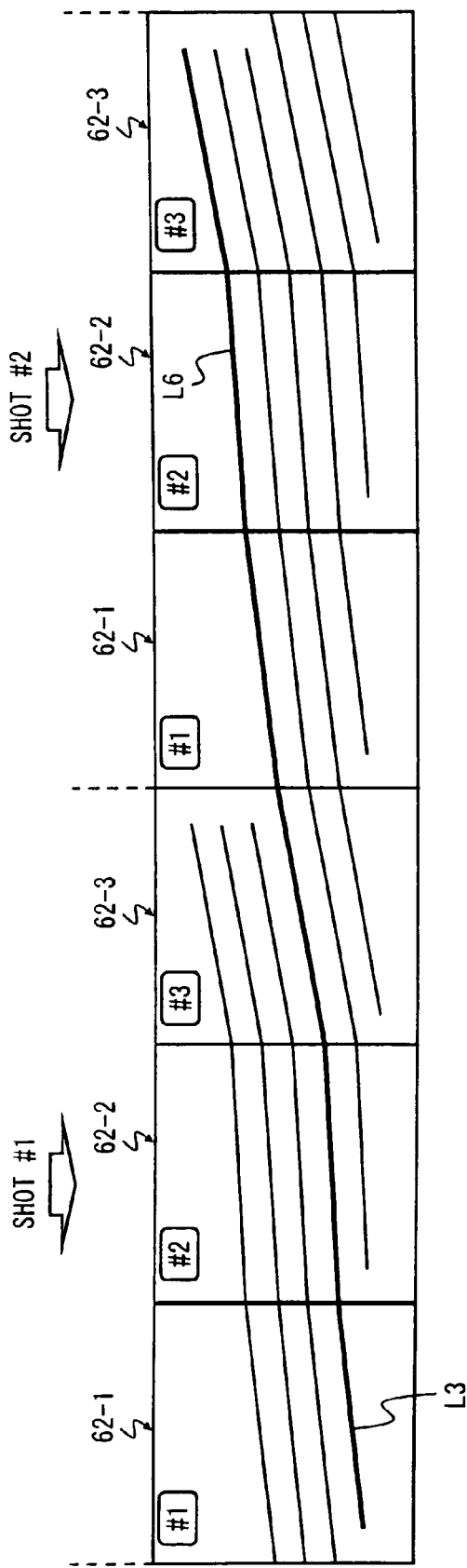
FIG. 17 is a plan view illustrating a wider range of the semiconductor wafer of FIG. 16.

FIG. 17 illustrates a wafer formed by performing two-shot step-and-repeat exposure using a mask including the wiring pattern of FIG. 16. FIG. 17 illustrates a total of six chips of the entire horizontal direction of the wafer. By complying with the abovementioned wiring pattern rules (1b) to (3b), it is possible to form a wiring pattern in which at least one wire is continuous over the entire horizontal direction of the wafer, as illustrated in FIG. 17. The continuous wire (indicated by the thick solid wire in FIG. 17) formed by coupling the wires L3 and L6 enables to collectively write different X coordinates in the six chips. Note that in this case, it is not necessary to connect all the wires over the principal surface of each chip to the semiconductor element, but only the wires L3 and L6 may be connected to the semiconductor element.

Moreover, as described with reference to FIGS. 6A and 6B, a voltage may be supplied to the six wires of the rightmost chip (the chip 62-3 obtained in the second shot). This method also enables to collectively write different X coordinates in each of the six chips, as the number of wires applied with a voltage differs among the six chips of FIG. 16.

The above mentioned exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor chip comprising:
    a rectangle principal surface including a first and a second side that oppose each other;
    a first and a second semiconductor element formed on the principal surface;
    a first wire that is formed on the principal surface from the first side to reach the second side, and coupled to the first semiconductor element; and
    a second wire that is formed on the principal surface to contact at least the first side, and coupled to the second semiconductor element,
    wherein an edge part of the first wire on the second side and an edge part of the second wire on the first side are placed to substantially position on a common straight line which is vertical to the first and the second sides.

2. The semiconductor chip according to claim 1, further comprising a third wire that is formed on the principal surface from the first side to reach the second side, and electrically connected to the first wire on the principal surface,
    wherein both edge parts of the third wire on the first and the second sides are placed to substantially position on a common straight line which is vertical to the first and the second sides.

3. The semiconductor chip according to claim 1, wherein
    the first semiconductor element includes a first non-volatile memory device that is able to specify storage content according to whether or not to apply an electric signal to the first wire, and
    the second semiconductor element includes a second non-volatile memory device that is able to specify storage content according to whether or not an electric signal is applied to the second wire.

4. The semiconductor chip according to claim 1, further comprising:
    a third and a fourth semiconductor element that are formed on the principal surface;
    a fourth wire that is formed on the principal surface from a third side to reach a fourth side of the principal surface, and coupled to the third semiconductor element; and
    a fifth wire that is formed on the principal surface to contact at least the third side, and coupled to the fourth semiconductor element,
    wherein an edge part of the fourth wire on the fourth side and an edge part of the fifth wire on the third side are placed to substantially position on a common straight line which is vertical to the third and the fourth sides.

5. A semiconductor wafer comprising at least two of the semiconductor chips according to claim 1,
    wherein the two semiconductor chips are placed to be adjacent while the second side of one of the chips contacts the first side of the other of the chips, and the first wire of the one chip and the second wire of the one chip are electrically connected.

6. The semiconductor chip according to claim 3, wherein the first and the second non-volatile memory devices store identification information that can identify a position of the semiconductor chip in a wafer surface.

7. The semiconductor chip according to claim 3, wherein each of the first and the second non-volatile memory devices includes a fuse element or an anti-fuse element.

8. The semiconductor chip according to claim 4, further comprising a sixth wire that is formed on the principal surface from the third side to reach the fourth side, and electrically connected to the fourth wire on the principal surface,
    wherein both edge parts of the sixth wire on the third and the fourth sides are placed to substantially position over a common straight line which is vertical to the third and the fourth sides.

9. A semiconductor wafer comprising m (m is an integer of two or more) number of semiconductor chips that are placed to be adjacent in one direction, wherein
    each chip comprises a rectangle principal surface including a first and a second side that oppose each other, and the first side of one of the adjacent chips contacts the second side of another of the adjacent chips,
    the m number of chips comprises a wiring pattern that repeats by a unit of n (n is an integer from 1 to m/2) number of chips,
    the wiring pattern includes j (j is an integer of m or more) number of wires,
    at least (m−n) number of wires among the j number of wires contact the first side of one endmost chip among the n number of chips, and the (m−n) number of wires are extend over the principal surface of the other endmost chip among the n number of chips, at least (m−n) number of wires among the j number of wires contact the second side of the other endmost chip, and at least one wire among the (m−n) number of wires contacting the second side of the other endmost chip extends over the principal surface of the one endmost chip, at least (m−2n) number of wires among the j number of wires are formed to penetrate from the first side of the one endmost chip to the second side of the other endmost chip, each of the j number of wires is coupled to a semiconductor circuit over at least a part of the principal surfaces among the principal surfaces of the n number of chips, and each of edge parts of the (m−n) number of wires contacting the first side of the one endmost chip is placed substantially position on a common straight line with one of edge parts of different wires than itself among the (m−n) number of wires contacting the second side of the other endmost chip, the common straight line is vertical to the first and the second sides.

10. The semiconductor wafer according to claim 9, wherein the semiconductor circuit is a non-volatile memory circuit that is specified with storage content according to an applied state of an electric signal to the j number of wires.

11. A method of fabricating a semiconductor chip comprising:

forming a first and a second semiconductor element in a rectangle area on a wafer surface;

forming a first wire that is placed from a first side to reach an opposing second side of the rectangle area, and coupled to the first semiconductor element; and forming a second wire that is placed to contact at least the first side, and coupled to the second semiconductor element, wherein an edge part of the first wire on the second side and an edge part of the second wire on the first side are placed to substantially position on a common straight line which is vertical to the first and the second sides.

12. The method according to claim 11, further comprising forming a third wire that is placed on the rectangle area from the first side to reach the second side, and electrically connected to the first wire on the rectangle area, wherein both edge parts of the third wire on the first and the second sides are placed to substantially position on a common straight line which is vertical to the first and the second sides.

13. The method according to claim 11, wherein the first semiconductor element includes a first non-volatile memory device that is able to specify storage content according to whether or not to apply an electric signal to the first wire, and the second semiconductor element includes a second non-volatile memory device that is able to specify storage content according to whether or not an electric signal is applied to the second wire.

* * * * *